(12) United States Patent
Finlay, Sr. et al.

(10) Patent No.: US 6,980,005 B2
(45) Date of Patent: Dec. 27, 2005

(54) CIRCUIT PROTECTION DEVICE WITH TIMED NEGATIVE HALF-CYCLE SELF TEST

(75) Inventors: David A. Finlay, Sr., Marietta, NY (US); Jeffrey C. Richards, Baldwinsville, NY (US)

(73) Assignee: Pass & Seymar, Inc., Syracuse, NY (US)

( * ) Notice: Subject to any disclaimer, the term of this patent is extended or adjusted under 35 U.S.C. 154(b) by 0 days.

(21) Appl. No.: 10/868,610

(22) Filed: Jun. 15, 2004

(65) Prior Publication Data

US 2005/0212522 A1    Sep. 29, 2005

Related U.S. Application Data

(63) Continuation-in-part of application No. 10/668,654, filed on Sep. 23, 2003, now Pat. No. 6,873,158.

(51) Int. Cl.[7] .................... G01R 31/327; G01R 31/14
(52) U.S. Cl. ........................... 324/424; 324/509
(58) Field of Search ............... 324/424, 509, 324/510, 523, 527; 361/42, 63

(56) References Cited

U.S. PATENT DOCUMENTS

| | | | | |
|---|---|---|---|---|
| 3,930,187 A | 12/1975 | Misencik | ...................... | 361/45 |
| 4,672,501 A | 6/1987 | Bilac et al. | ..................... | 361/96 |
| 4,742,422 A | 5/1988 | Tigges | .......................... | 361/45 |
| 5,459,630 A | 10/1995 | MacKenzie et al. | ........... | 361/45 |
| 5,600,524 A | 2/1997 | Neiger et al. | ................... | 361/42 |
| 5,715,125 A | 2/1998 | Neiger et al. | ................... | 361/42 |
| 6,052,265 A | 4/2000 | Zaretsky et al. | ............... | 361/42 |
| 6,111,733 A * | 8/2000 | Neiger et al. | ................... | 361/42 |
| 6,262,871 B1 | 7/2001 | Nemir et al. | ................... | 361/42 |
| 6,313,642 B1 * | 11/2001 | Brooks | ......................... | 324/547 |
| 6,437,700 B1 | 8/2002 | Herzfeld et al. | ............. | 340/650 |
| 6,580,344 B2 | 6/2003 | Li | ............................... | 335/18 |
| 6,611,406 B2 | 8/2003 | Neiger et al. | ................... | 361/45 |
| 6,674,289 B2 * | 1/2004 | Macbeth | ....................... | 324/509 |
| 6,697,237 B2 | 2/2004 | Duve | ............................ | 361/42 |
| 6,873,158 B2 * | 3/2005 | Macbeth | ....................... | 324/509 |
| 2002/0135957 A1 | 9/2002 | Chan et al. | .................... | 361/42 |
| 2002/0181175 A1 | 12/2002 | Baldwin | ....................... | 361/42 |
| 2003/0016477 A1 | 1/2003 | Li | ............................... | 361/42 |
| 2003/0086220 A1 | 5/2003 | Nelson | .......................... | 361/49 |
| 2004/0004795 A1 | 1/2004 | Chan et al. | .................... | 361/42 |

* cited by examiner

Primary Examiner—Anjan Deb
(74) Attorney, Agent, or Firm—Daniel P. Malley; Bond, Schoeneck & King PLLC

(57) ABSTRACT

The present invention is directed to an electrical wiring protection device for use in coupling an AC power distribution system to at least one electrical load. The device includes an automated self-test circuit coupled to the AC power distribution system. The automated self-test circuit is configured to generate at least one simulated fault signal during a first predetermined half-cycle of AC power. A detector circuit is coupled to the automated self-test circuit. The detector circuit generates a detection signal in response to the at least one simulated fault signal. An interval timing circuit is coupled to the test circuit. The interval timing circuit is configured to enable the automated self-test circuit to generate the at least one simulated fault signal during a first predetermined interval and not enable the test circuit during a subsequent second predetermined interval. The first predetermined interval and the second predetermined interval are recurring time intervals.

71 Claims, 12 Drawing Sheets

CIRCUIT PROTECTION DEVICE WITH TIMED NEGATIVE HALF-CYCLE SELF TEST

CROSS-REFERENCE TO RELATED APPLICATIONS

This is a continuation-in-part of U.S. patent application Ser. No. 10/668,654 filed on Sep. 23, 2003, now U.S. Pat. No. 6,873,158, issued on Mar. 29, 2005 the content of which is relied upon and incorporated herein by reference in its entirety, and the benefit of priority under 35 U.S.C. § 120 is hereby claimed. U.S. patent application Ser. No. 10/668,654 claims priority under 35 U.S.C. §120 based on U.S. Pat. No. 6,674,289, which was filed on Nov. 29, 2000, the content of which is also relied upon and incorporated herein by reference in its entirety. U.S. Pat. No. 6,674,289 claims priority under 35 U.S.C. §119(e) based on U.S. Provisional Patent Application Ser. No. 60/183,273, filed Feb. 17, 2000, the contents of which are relied upon and incorporated herein by reference in their entirety.

BACKGROUND OF THE INVENTION

1. Field of the Invention

The present invention relates generally to electric circuit protection devices, and particularly to protection devices which periodically self check for simulated fault conditions.

2. Technical Background

Electric systems used to supply AC power to residential, commercial, and industrial facilities typically include a breaker panel that is configured to receive power from a utility source. The breaker panel distributes AC power to one or more branch electric circuits disposed in the facility. The electric circuits transmit AC power to one or more electrically powered devices, commonly referred to in the art as load circuits. Each electric circuit typically employs one or more electric circuit protection devices. Examples of such devices include ground fault circuit interrupters (GFCIs), arc fault circuit interrupters (AFCIs), or both GFCIs and AFCIs. Further, AFCI and GFCI protection may be included in one protective device.

A protective device may be conveniently packaged in a receptacle that is configured to be installed in a wall box. The receptacle includes input terminals configured to be connected to an electric branch circuit, i.e., the receptacle includes a hot line terminal and a neutral line terminal for connection to a hot power line and a neutral power line, respectively. The receptacle includes output terminals configured to be connected to a load circuit. In particular, the receptacle has feed-through terminals that include a hot load terminal and a neutral load terminal. The receptacle also includes user accessible plug receptacles connected to the feed through terminals. Accordingly, load devices equipped with a cord and plug may access AC power by way of the user accessible plug receptacles.

When a fault condition is detected, the protection device eliminates the fault condition by interrupting the flow of electrical power to the load circuit by causing interrupting contacts to break the connection between the line terminals and load terminals. As indicated by the name of each respective device, an AFCI protects the electric circuit in the event of an arc fault, whereas a GFCI guards against ground faults. An arc fault is a discharge of electricity between two or more conductors. An arc fault may be caused by damaged insulation on the hot line conductor or neutral line conductor, or on both the hot line conductor and the neutral line conductor. The damaged insulation may cause a low power arc between the two conductors and a fire may result. An arc fault typically manifests itself as a high frequency current signal. Accordingly, an AFCI may be configured to detect various high frequency signals and de-energize the electrical circuit in response thereto.

On the other hand, a ground fault occurs when a current carrying (hot) conductor contacts ground to create an unintended current path. The unintended current path represents an electrical shock hazard. Further, because some of the current flowing in the circuit is diverted into the unintended current path, a differential current is created between the hot/neutral conductors. As in the case of an arc fault, ground faults may also result in fire. A ground fault may occur for several reasons. If the wiring insulation within a load circuit becomes damaged, the hot conductor may contact ground, creating a shock hazard for a user. A ground fault may also occur when the equipment comes in contact with water. A ground fault may also be caused by damaged insulation within the facility.

As noted above, a ground fault creates a differential current between the hot conductor and the neutral conductor. Under normal operating conditions, the current flowing in the hot conductor should equal the current in the neutral conductor. Thus, GFCIs typically compare the current in the hot conductor(s) to the return current in the neutral conductor by sensing the differential current between the two conductors. The GFCI may respond by actuating an alarm and/or interrupting the circuit. Circuit interruption is typically effected by opening the line between the source of power and the load.

Another type of ground fault may occur when the load neutral terminal, or a conductor connected to the load neutral terminal, becomes grounded. This condition does not represent an immediate shock hazard. Under normal conditions, a GFCI will trip when the differential current is greater than or equal to approximately 6 mA. However, when the load neutral conductor is grounded the GFCI becomes de-sensitized because some of the return path current is diverted to ground. When this happens, it may take up to 30 mA of differential current before the GFCI trips. This scenario represents a double-fault condition, i.e., when both the hot conductor and the load neutral conductor are grounded, the GFCI may fail to trip, causing a user to experience serious injury or death.

Accordingly, it is desirable to provide a protection device that is capable of self-testing for both the grounded hot fault condition and the grounded neutral fault condition. In one approach that has been considered, a GFCI is configured to include a timer that initiates a periodic self test of the GFCI. Alternatively, the GFCI initiates a periodic alarm to alert the user to manually push the test button on the GFCI. One drawback to this approach is that the circuitry is relatively expensive and increases the size of the GFCI circuitry.

In another approach that has been considered, a GFCI includes a visual indicator adapted to display a miswire condition. If the hot power source conductor and the neutral power source conductor are inadvertently miswired to the load terminals of the GFCI, the visual indicator is actuated to display the miswire alarm condition. Those of ordinary skill in the art will understand that a miswire condition of this type will result in a loss of GFCI protection at the duplex receptacles on the face of the GFCI. One drawback to this approach is that the GFCI does not include a self-test of the electrical circuit. Another drawback to this approach is that the visual display does not indicate a lock-out of load side power by the interrupting contacts. As such, the user is obliged to correctly interpret and take action based on appearance of the visual indicator.

In yet another approach that has been considered, a GFCI is configured to self-test the relay solenoid that opens the GFCI interrupting contacts when a fault condition is sensed. However, the self-test does not include a test of the electrical circuit.

In yet another approach that has been considered, the self-test is configured to detect the failure of certain components, such as the silicon controlled rectifier (SCR). If a failure mode is detected, the device is driven to a lock-out mode, such that power is permanently de-coupled from the load.

In light of all of the approaches discussed above, there are many other types of failures, such as those involving the GFCI sensing circuitry, that require manual testing. Of course, manual testing requires a user to push the test button disposed on the GFCI. If a fault condition is present, the GFCI trips out after the test button is pushed. This prompts the user to reset the GFCI. If the device fails to reset, the user understands that the device has failed and is in a lock-out condition. This approach has drawbacks as well. While regular testing is strongly encouraged by device manufacturers, in reality, few users test their GFCIs on a regular basis.

Therefore, there is a need for a protection device that is configured to self-test internal device components. There is a further need for a GFCI that is adapted to self-test for both the grounded hot fault condition and the grounded neutral fault condition. There is also a need for a self-testing GFCI which performs self-testing every half-cycle, during a time period when the SCR tripping mechanism does not conduct. There is yet another need for a self-testing device that self-tests without generating false tripping. Finally, a need exists for a self-testing protection device that is characterized by noise immunity.

SUMMARY OF THE INVENTION

The present invention addresses the needs described above by providing a protection device that is configured to self-test internal device components. The present invention is adapted to self-test for both the grounded hot fault condition and the grounded neutral fault condition. The present invention performs self-testing every half-cycle, during a time period when the SCR tripping mechanism does not operate. The self-testing device of the present invention self-tests without generating false tripping. Finally, the present invention is characterized by noise immunity.

One aspect of the present invention is an electrical wiring protection device for use in coupling AC power through an AC power distribution system to at least one electrical load. The device includes an automated self-test circuit coupled to the AC power distribution system. The test circuit is configured to generate at least one simulated fault signal during a first predetermined half-cycle polarity of AC power. A detector circuit is coupled to the automated self-test circuit. The detector circuit generates a detection signal in response to the at least one simulated fault signal. An interval timing circuit is coupled to the automated self-test circuit. The interval timing circuit is configured to enable the automated self-test circuit to generate the at least one simulated fault signal during a first predetermined interval and not enable the automated self-test circuit during a subsequent second predetermined interval. The first predetermined interval and the second predetermined interval are recurring time intervals.

In another aspect, the present invention includes an electrical wiring protection device for use in coupling an AC power through an AC power distribution system to at least one electrical load. The device includes a test circuit coupled between a hot conductor and a neutral conductor of the AC power distribution system. The test circuit is configured to generate at least one simulated fault signal during a first predetermined half-cycle polarity of AC power. A detector circuit is coupled to the test circuit. The detector circuit generates a detection signal in response to the at least one simulated fault signal. An interval timing circuit is coupled to the test circuit. The interval timing circuit is configured to enable the test circuit to generate the at least one simulated fault signal during a first predetermined interval and not enable the test circuit during a subsequent second predetermined interval. The first predetermined interval and the second predetermined interval are recurring time intervals. A gate circuit is coupled to the detector circuit. The gate circuit generates a gated test detection pulse in response to receiving the detection signal. The gated test detection pulse corresponds to the at least one simulated fault signal and has a duration not extending into a second predetermined half-cycle polarity of AC power subsequent to the first predetermined half-cycle of AC power. A checking circuit is coupled to the gate circuit. The checking circuit includes a timer configured to initiate an end-of-life fault signal if the gated test detection pulse is not received within a predetermined period of time. A response mechanism is coupled to the checking circuit. The response mechanism is actuated in response to the end-of-life fault signal.

In yet another aspect, the present invention includes an electrical wiring protection device for use in coupling an AC power distribution system to at least one electrical load. The device includes a test circuit coupled to the AC power distribution system. The test circuit is configured to generate at least one simulated fault signal during a first predetermined half-cycle polarity of AC power. A detector circuit is coupled to the test circuit. The detector circuit generates a detection signal in response to the at least one simulated fault signal. A processor is coupled to the test circuit and the detector circuit. The processor is programmed to: generate a self-test enable signal during a first predetermined time interval and not during a second predetermined time interval, the self-test enable signal enabling the test circuit to generate the at least one simulated fault signal; and generate a gated test detection pulse in response to receiving the detection signal, the gated test detection pulse corresponding to the at least one simulated fault signal and having a pulse duration not extending into a second predetermined half cycle polarity of AC power subsequent to the first predetermined half cycle polarity of AC power. A checking circuit is coupled to the processor. The checking circuit includes a timer configured to initiate an end-of-life fault signal if the gated test detection pulse is not received within a predetermined period of time. A response mechanism is coupled to the checking circuit. The response mechanism is actuated in response to the end-of-life fault signal.

In yet another aspect, the present invention includes a method for automatically self testing an electrical wiring protection device for use in coupling an AC power distribution system to at least one electrical load. The device includes the step of generating at least one simulated fault signal during a first predetermined polarity of AC power. The at least one simulated fault is generated during a test state interval and not being generated during a subsequent non-test state interval. The test state interval and the non-test state interval are recurring time intervals each of predetermined length. A detection signal is transmitted in response to detecting the at least one simulated fault signal. A gated test detection pulse is generated in response to the detection signal. The gated test detection pulse has a pulse duration not extending into a second predetermined polarity of AC power. An end-of-life fault signal is initiated if the gated detection pulse is not received within a predetermined period of time.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION

Figure 1:
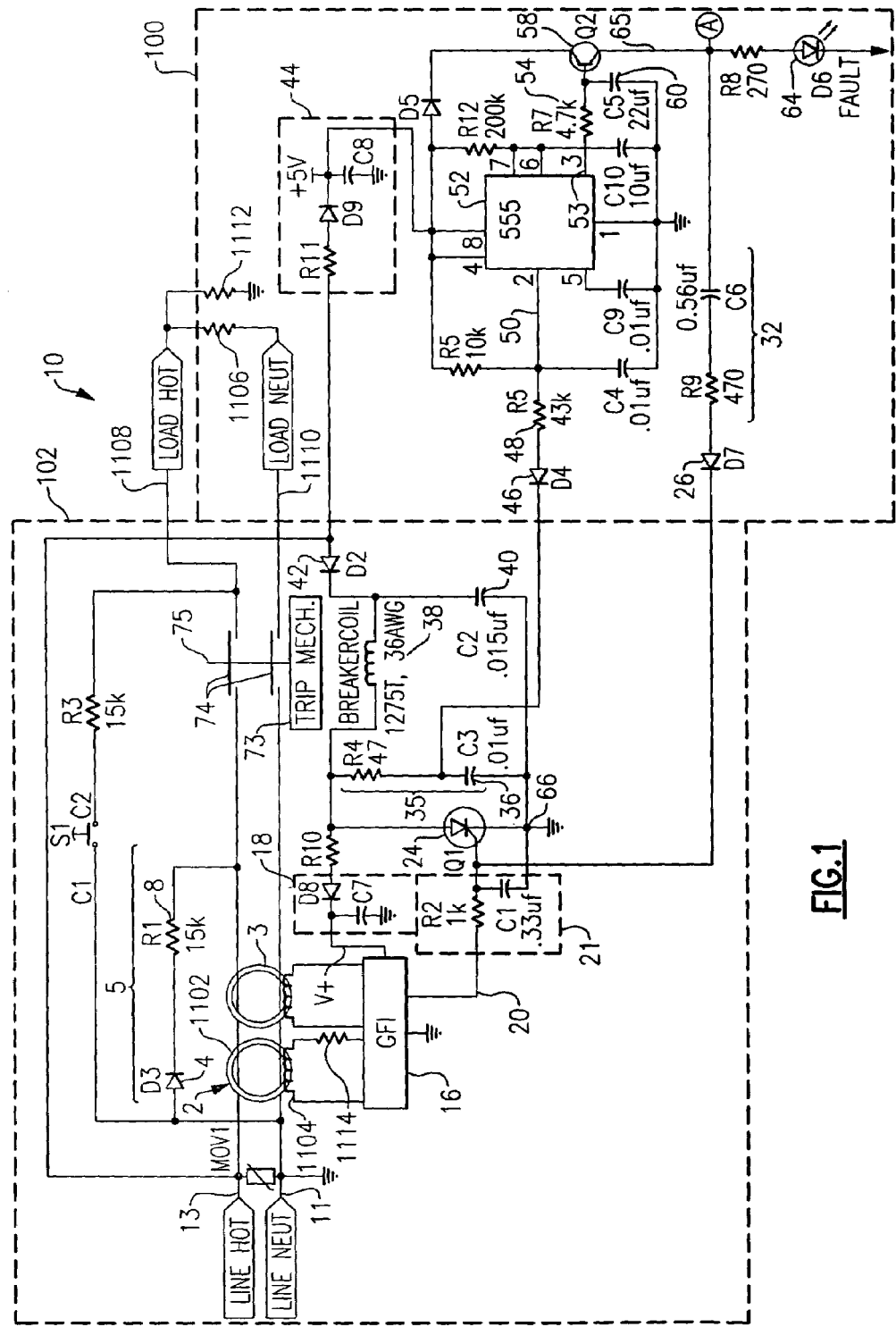
FIG. 1 is a schematic of a circuit protection device in accordance with one embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the protection device of the present invention is shown in FIG. 1, and is designated generally throughout by reference numeral 10.

In accordance with the invention, the present invention is directed to an electrical wiring protection device for use in coupling AC power through an AC power distribution system to at least one electrical load. The device includes an automated self-test circuit coupled to the AC power distribution system. The test circuit is configured to generate at least one simulated fault signal during a first predetermined half-cycle polarity of AC power. A detector circuit is coupled to the automated self-test circuit. The detector circuit generates a detection signal in response to the at least one simulated fault signal. An interval timing circuit is coupled to the automated self-test circuit. The interval timing circuit is configured to enable the automated self-test circuit to generate the at least one simulated fault signal during a first predetermined interval and not enable the automated self-test circuit during a subsequent second predetermined interval. The first predetermined interval and the second predetermined interval are recurring time intervals.

Accordingly, the present invention provides a protection device that is configured to self-test internal device components. The present invention is adapted to self-test for both the grounded hot fault condition and the grounded neutral fault condition. The instant self-testing GFCI performs self-testing every half-cycle, during a time period when the SCR tripping mechanism does not conduct. Furthermore, the self-testing device of the present invention self-tests without generating false tripping. Finally, the protection device of the present invention is characterized by noise immunity.

As embodied herein, and depicted in FIG. 1, a schematic of a circuit protection device 10 in accordance with one embodiment of the present invention is disclosed. In particular, FIG. 1 is an illustration of a GFCI 10 which self checks for ground fault detection every negative half cycle during the period when an electronic switch such as an SCR 24 cannot conduct. If the self test fails, GFCI 10 is tripped out on the subsequent positive half cycle. GFCI 10 includes a GFI circuit 102 and a self test checking circuit 100. GFI circuit 102 includes a standard GFCI device in which a load-side ground fault is sensed by a differential transformer 2. A transformer 3, which is a grounded neutral transmitter, is used to sense grounded neutral faults. The transformer 2 output is processed by a GFI detector circuit 16 which produces a signal on output 20 that, after filtering in a circuit 21, activates a trip SCR 24. When SCR 24 turns ON, it activates a solenoid 38 which in turn operates a mouse trap device 73, releasing a plurality of contacts 74 and interrupting the load.

A power supply 18 provides power for GFI detector circuit 16 for full cycle operation. A negative cycle bypass circuit 5, which preferably includes a diode 4 in series with a resistor 8, introduces a bypass current, simulating a ground fault, between neutral and hot lines 11, 13 during the negative half cycle of the AC power. The same bypass current could also be produced by placing bypass circuit 5 between lines 11 and 13 with the diode 4 anode at neutral line 11.

The GFI 102 output circuit is formed by placing capacitor 40 in series with solenoid 38 to thereby form a resonating tank circuit. The tank circuit is placed in parallel with SCR 24 and a snubber circuit 35. Capacitor 40 charges on the positive half cycle of the AC power, but is prevented from discharging on the negative half cycle of the AC power by a blocking diode 42.

An across-the-line metal oxide varistor (MOV1), also commonly referred to as a movistor, may be included in the protective device such as MOV 15 to prevent damage of the protective device from high voltage surges from the AC power source. The movistor is typically 12 mm in size.

Figure 2:
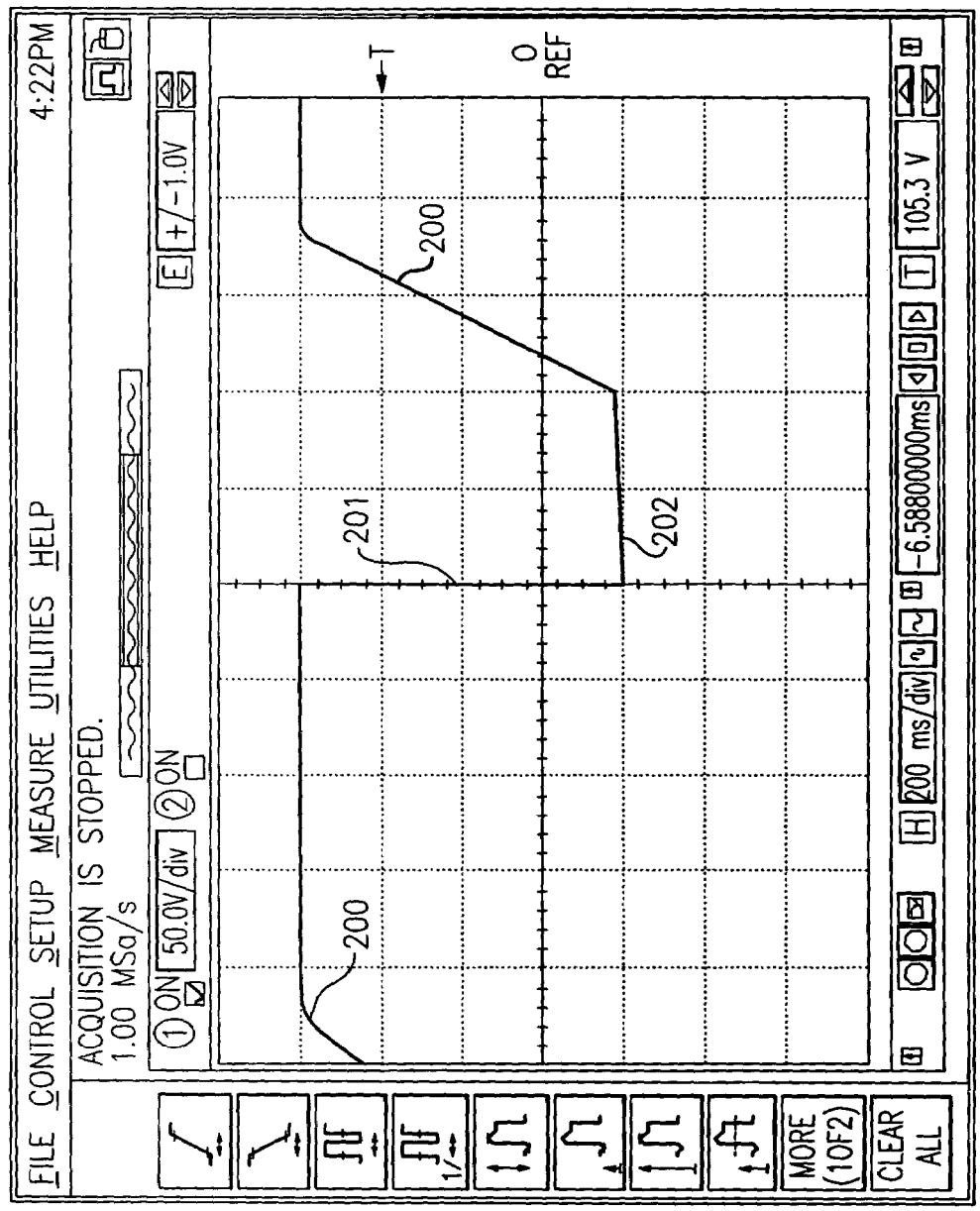
FIG. 2 is a chart showing the ground fault interrupter (GFI) circuit output voltage under normal conditions.

Referring to FIG. 2, a chart showing the ground fault interrupter (GFI) circuit output voltage under normal operating conditions is disclosed. Accordingly, capacitor 40 is charged to the peak of the AC wave as shown at point 200. On each negative portion of the AC wave, when SCR 24 cannot conduct line current, bypass 5 introduces a simulated ground fault which is sensed by transformers 2 and detected by GFI detector circuit 16, thereby activating SCR 24. Activation of SCR 24 discharges capacitor 40 through solenoid 38 and SCR 24 as shown at point 201. Capacitor 40 and solenoid 38 form a resonant circuit. When SCR 24 discharges capacitor 40 during the negative AC power cycle, a field is built up around solenoid 38 which, when collapsing, causes a recharge of capacitor 40 in the opposite direction, thereby producing a negative voltage across the capacitor when referenced to circuit common. When the SCR current falls below the minimum holding current, SCR 24 switches OFF, so that the negative charge remains on capacitor 40 until the next positive AC cycle. At that time, current passing through diode 42 charges capacitor 40 in the positive voltage direction. The negative voltage across capacitor 40 also appears across capacitor 36 of snubber circuit 35 as shown at point 202.

Figure 3:
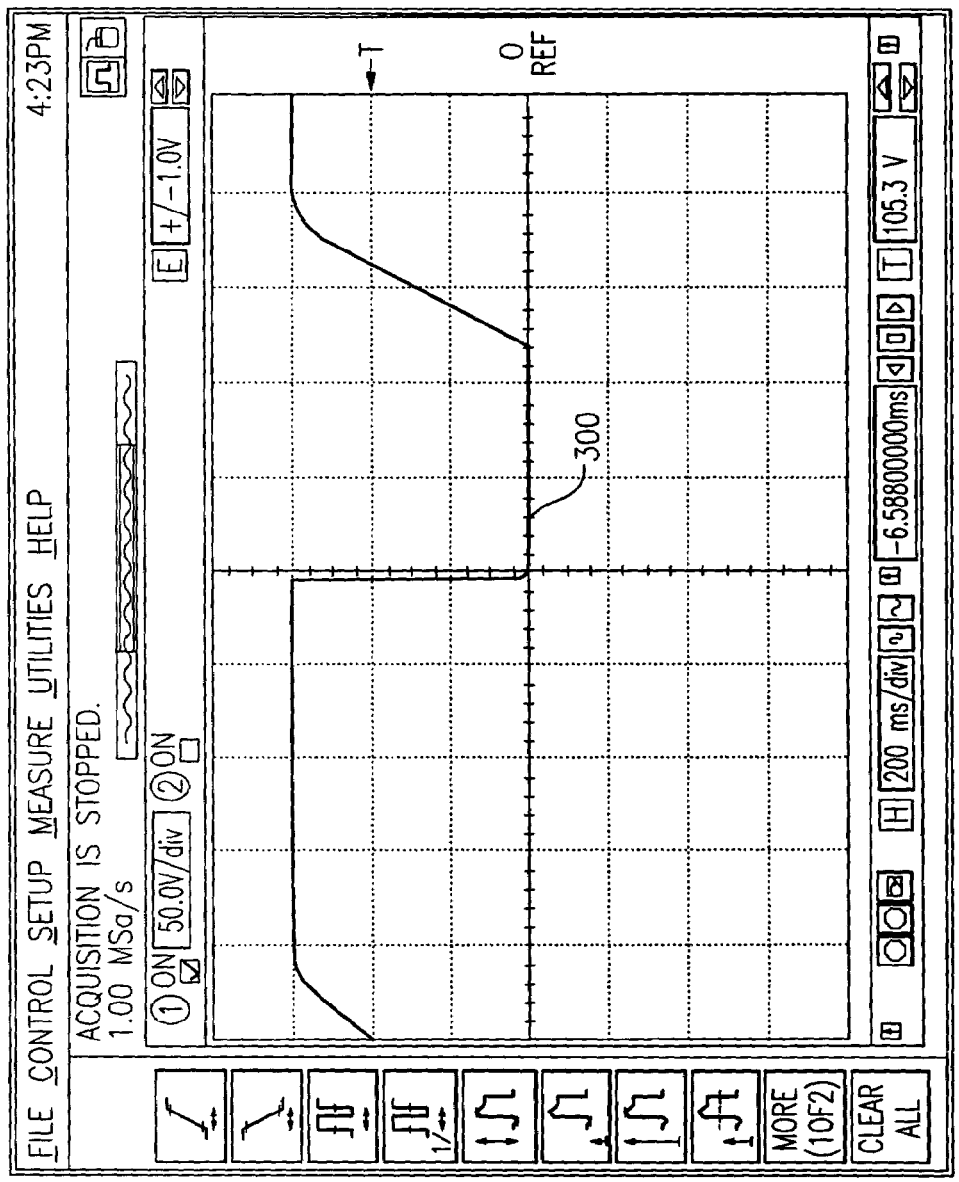
FIG. 3 is a chart showing the GFI circuit output voltage under an internal fault condition.

Referring to FIG. 3, a chart showing the GFI circuit output voltage under an internal fault condition is shown. For example, the negative voltage across capacitor 40 does not appear if solenoid 38 is shorted because no solenoid magnetic field exists to collapse and produce the negative voltage. Thus, if any of the components including differential transformer 2, GFI detector circuit 16, circuit 21, power supply 18, SCR 24, solenoid 38, capacitor 40, and blocking diode 42 of circuit 102 fail, capacitor 40 does not discharge through solenoid 38, and the negative voltage across capacitor 40 from the collapsing field of solenoid 38 does not appear.

Referring back to FIG. 1, checking circuit 100 is a stand-alone circuit preferably with its own power supply 44 providing power to a timer 52. Timer 52 is shown here as a 555 timer, but other timers known to those skilled in the art can be used. When the negative voltage appears across capacitor 40 and therefore across capacitor 36 as described above, a diode 46 conducts, pulling an input 50 of timer 52 LOW, triggering timer 52 into a monostable timeout mode. An output 53 of timer 52 goes HIGH, keeping a transistor 58 turned OFF. The timeout of timer 52 is long enough for timer 52 to be repeatedly re-triggered by the negative cycle discharge of capacitor 40 so that timer 52 does not time out. Thus, output 53 stays HIGH keeping transistor 58 OFF. An optional integrator formed by a resistor 54 and a capacitor 60 acts to hold transistor 58 OFF during any brief transitions when timer 52 times out just before timer 52 is re-triggered.

If GFI circuit 102 fails to discharge capacitor 40 to a negative voltage, then timer 52 is not re-triggered, causing output 53 to go LOW and turning transistor 580N. Turning transistor 580N preferably activates a fault lamp 64 thereby indicating a failure of GFCI circuit 102. Turning transistor 580N sends a signal through a differentiator 32 and blocking diode 26 to trigger SCR 24. Differentiator 32 sends a one-shot pulse to SCR 24 which lasts long enough to overlap into a positive AC cycle, so that triggering SCR 24 activates mouse trap device 73, trips contacts 74, and disables GFCI 10. Optional outcomes of a failure in GFCI 10 are locking out power, indicating the failure on a lamp, or both.

Figure 4:
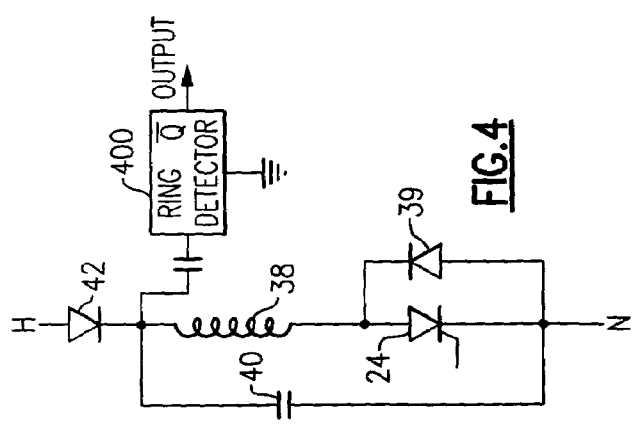
FIG. 4 is a schematic showing a GFI output circuit in accordance with another embodiment of the present invention.

As embodied herein and depicted in FIG. 4, a schematic showing a GFI output circuit in accordance with another embodiment of the present invention is disclosed. In this alternate embodiment, diode 39 replaces the snubber circuit 35 shown in FIG. 1. Diode 39 provides a bypass of SCR 24 and allows the ring to continue as energy moves back and forth between solenoid 38 and capacitor 40.

Figure 5:
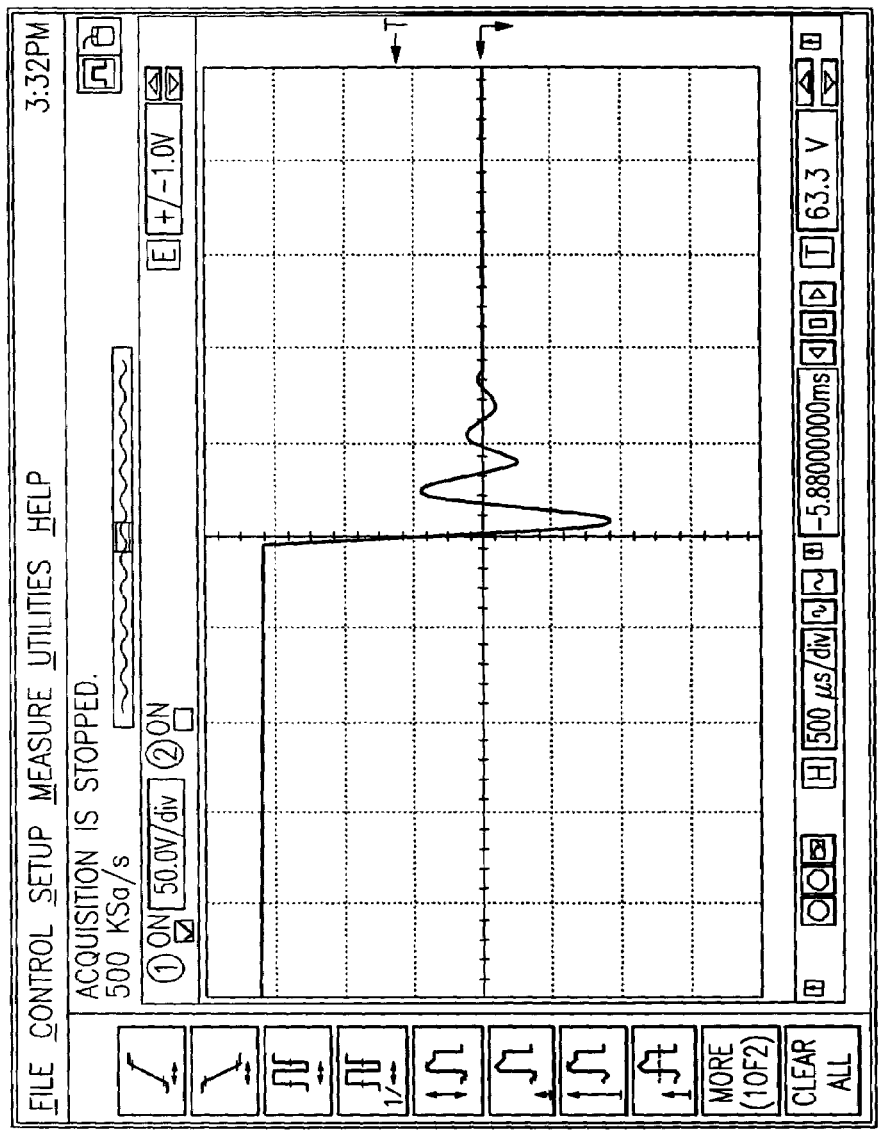
FIG. 5 is a chart showing the output voltage of the GFI output circuit depicted in FIG. 4 under normal conditions.

Referring to FIG. 5, the voltage waveform of the GFI output circuit depicted in FIG. 4 is shown. In particular, FIG. 5 shows the voltage ring across capacitor 40. Ring detector block 400 monitors the output voltage. Ring detector block 400 is performs a function similar to the one performed by checking circuit 100 shown in FIG. 1. The absence of a proper output ring voltage fails to reset the timer in circuit 400. Accordingly, the timer in circuit 400 will time out, indicating a failure of the GFI circuit 102. It will be apparent to those of ordinary skill in the pertinent art that modifications and variations can be made to ring detector block 400 of the present invention depending on the variations of the GFI output circuit and their resultant waveforms.

Figure 7:
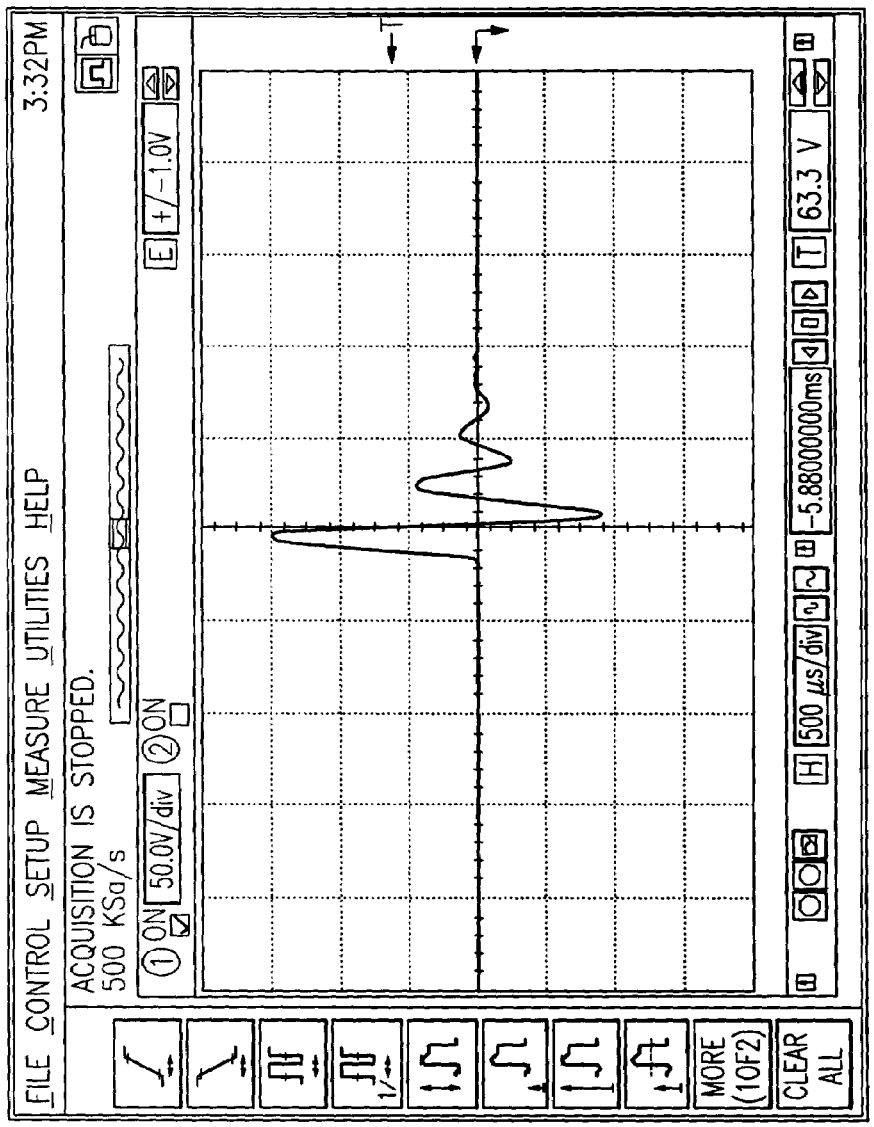
FIG. 7 is a chart showing the typical output voltage of the GFI output circuit depicted in FIG. 6.
Figure 6:
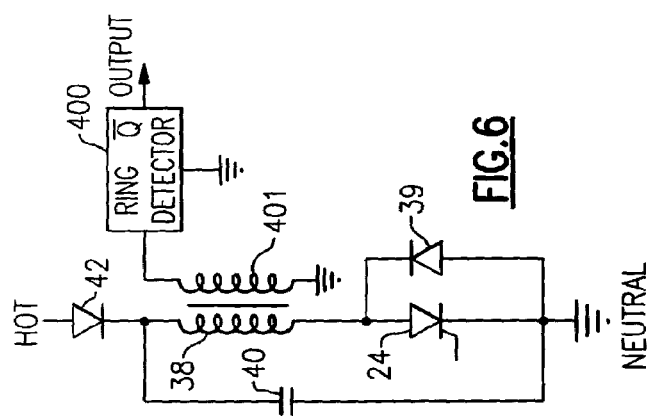
FIG. 6 is a schematic showing a GFI output circuit in accordance with yet another embodiment of the present invention.

As embodied herein and depicted in FIG. 6, a schematic showing a GFI output circuit in accordance with another embodiment of the present invention is disclosed. In this alternate embodiment, a secondary 401 intercepts the magnetic field from solenoid 38. Referring to FIG. 7, the output voltage waveform of the GFI output circuit depicted in FIG. 6 is shown. Detector circuit 400 detects the ring and issues an output if the ring fails due to circuit failure.

Figure 9:
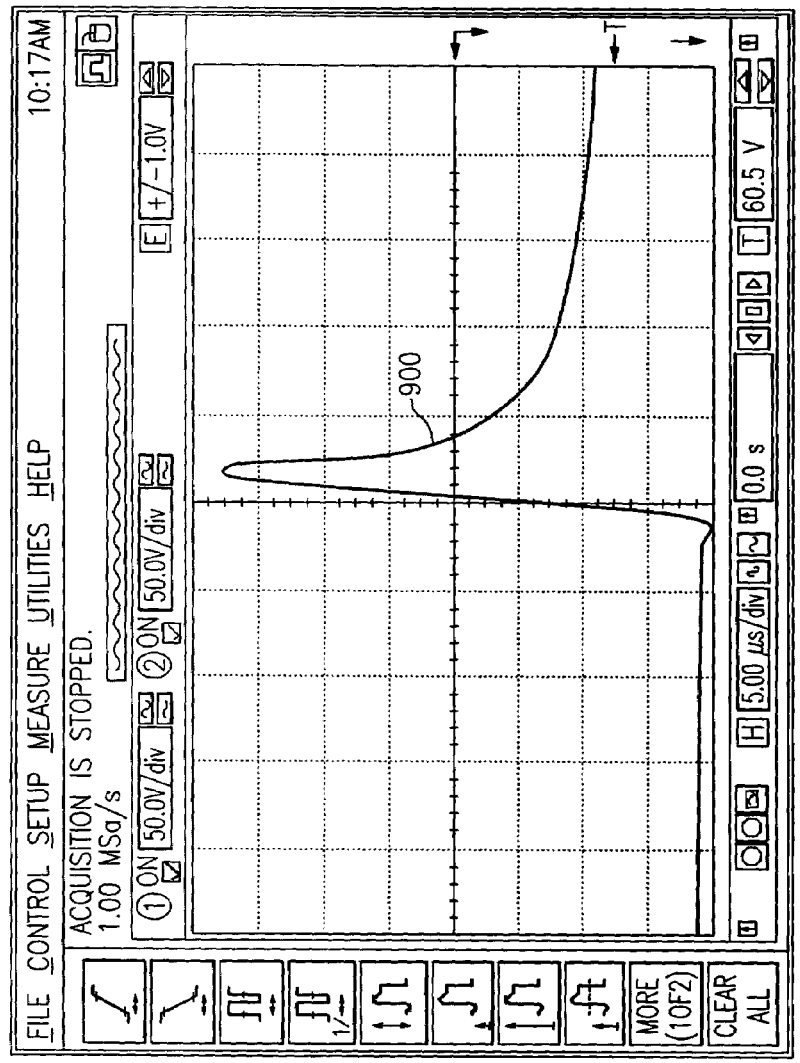
FIG. 9 is a chart showing the typical output voltage of the GFI output circuit depicted in FIG. 8.
Figure 8:
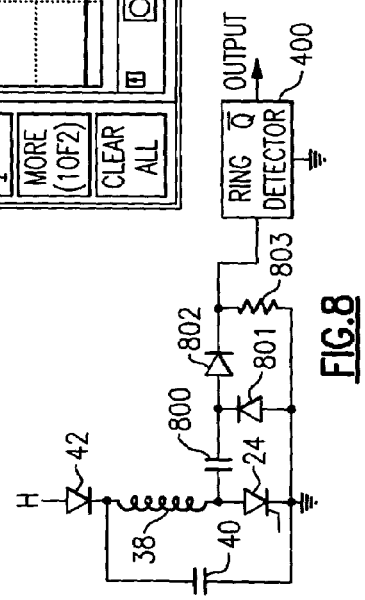
FIG. 8 is a schematic showing a GFI output circuit in accordance with yet another embodiment of the present invention.
Figure 10:
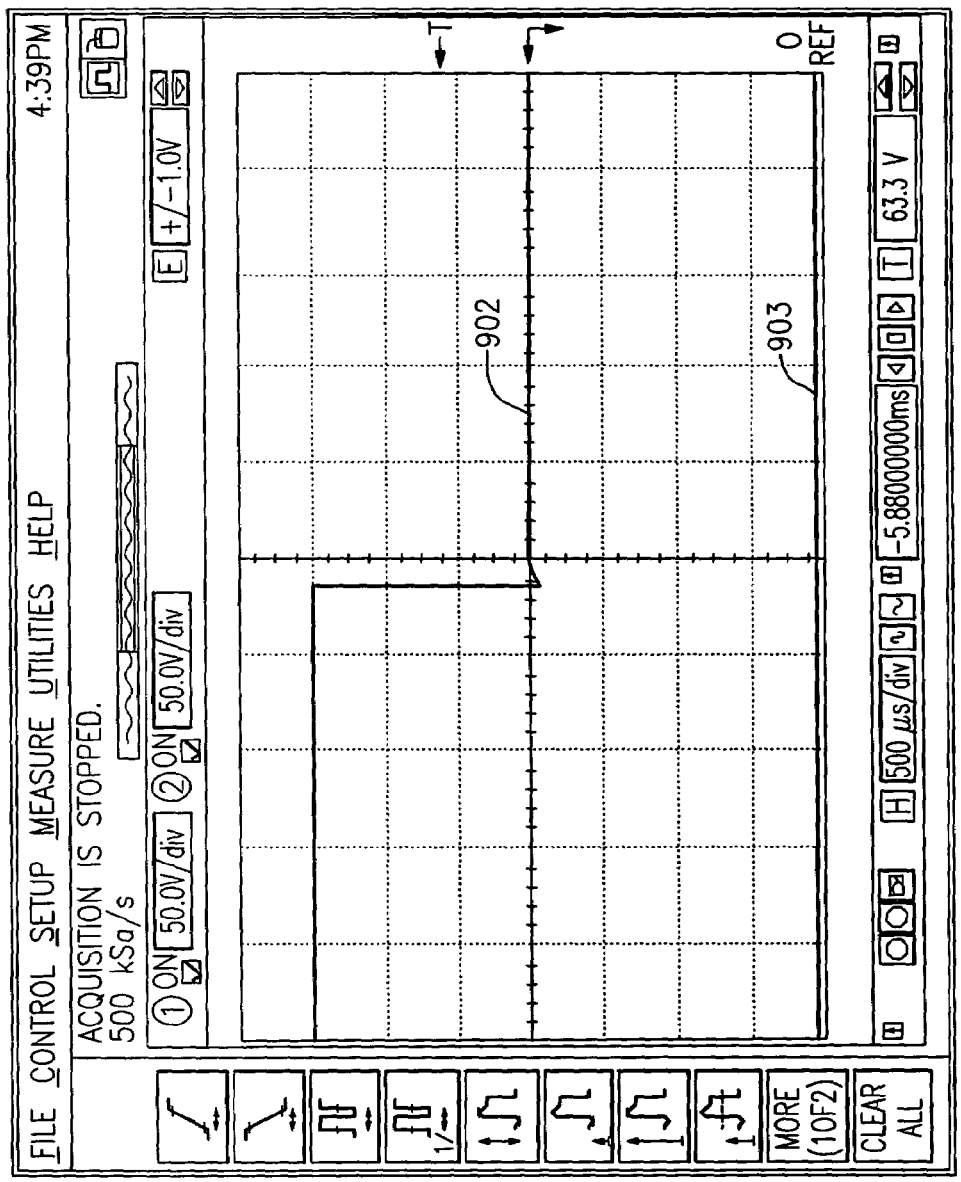
FIG. 10 is a chart showing the typical output voltage of the GFI output circuit depicted in FIG. 8 under a fault condition.

As embodied herein and depicted in FIG. 8, a schematic showing a GFI output circuit in accordance with yet another embodiment of the present invention is disclosed. Referring to FIGS. 8–10, another embodiment is shown for obtaining the ringing waveform. If the protective device is operational, SCR 24 turns on during the negative half cycles, causing capacitor 40 to discharge through solenoid 38. When the current through solenoid 38 starts to reverse in order to return stored energy to capacitor 40, SCR 24 turns off and the reverse current flows through diode 801, charging capacitor 800. There is a succession of ringing periods during the negative half cycle of the AC power source in which energy is transferred from capacitor 40 to solenoid 38 and back again. Each time the energy is transferred to solenoid 38, SCR 24 turns on. When SCR 24 is ON, the voltage across capacitor 800 forward biases diode 802 to produce a signal at the input of ring detector 400, shown in FIGS. 9 as positive pulse 900. Ring detector 400 produces an output signal upon detection of a predetermined number of one or more positive pulses, indicative of ringing.

FIG. 10 shows a GFI output circuit voltage waveform during a fault condition. In particular, FIG. 10 illustrates the circuit response when solenoid 38 is shorted. Waveform 902 is the voltage across the switching terminals of SCR 24. Waveform 903 is the waveform at the input of ring detector 400. When solenoid 38 is shorted, indicating a failed solenoid, SCR 24 conducts as before during the negative half cycle of the power source. Since diode 42 is non-conductive during the negative half cycle, SCR 24 discharges capacitor 40. Since solenoid 38 is shorted, it has little or no inductance. Thus capacitor 40 discharges as before, but due to lack of inductance there is no reverse current through diode 801 to produce a charge of the correct polarity on capacitor 800. Accordingly, capacitor 800 is unable to discharge a positive pulse through diode 802. Without the positive pulse, the timer in detector 400 is not reset before time out occurs. In response, ring detector 400 transmits an output signal and device 10 is tripped. Furthermore, failure of other components may be configured to prevent a ringing signal, including opening or shorting of solenoid 38, capacitor 40, capacitor 800 or diode 801.

It will be understood by those of ordinary skill in the art that although the circuit examples so far described perform a self test for correct circuit operation during the negative power cycle, i.e., when the SCR of the disclosed embodiments is inactive as far as carrying line current, the circuit reference and SCR orientation could be reversed so as to become non-conducting during the positive line cycle. Thus, the present invention is equally applicable to positive half-cycle testing. Further, in another embodiment, SCR 24 is replaced by another unipolar conducting device, such as a transistor or field effect transistor (FET), and placed in series with a blocking diode. Those of ordinary skill in the art will also recognize that circuits described herein may be adapted for use in a GFEP (ground fault equipment protector) or AFCI (arc fault interrupter circuit), as well as in a GFCI. Furthermore, although the GFCI is described herein as being connected to the hot and neutral lines, the present invention could be connected between any two lines, whether hot or neutral, multiple phase systems and multiple phase systems do not have a neutral conductor, by changing component values as appropriate.

As described above, the self-test signal is confined to either the negative half cycle or the positive half cycle of the AC power depending on whether negative half cycle or positive half cycle testing is employed. However, there are circumstances in which the self-test simulation signal is confined to a negative half cycle but the resulting self-test signal extends into one or more of the following cycles of AC power, including one or more positive half cycle. This phenomenon may have several deleterious effects. The presence of an extended signal in the positive half cycle may cause the protective device to false trip. Further, an extended signal may interfere with a true fault signal that device 10 is configured to detect during the positive half cycle. In other words, the interference of the extended signal affects the sensitivity of the device. Thus, the extended signal may result in device unresponsiveness or device false tripping, depending on whether the extended signal opposes or aids the true fault signal.

Referring again to FIG. 1, one possible cause of signal extension relates to the characteristics of transformer 2. As shown, transformer 2 includes a toroidal core 1102 through which neutral and hot lines 11 and 13 are passed to form primary windings. A secondary winding, 1104, is wound about the toroid. Toroidal core 1102 may be implemented using a magnetic material, having a predetermined permeability. As those of ordinary skill in the art understand, if there is a load 1106 coupled to hot and neutral load terminals 1108 and 1110, the currents through hot line 13 and neutral line 11 are equal and opposite, producing equal and opposite signals in the two primary windings. As a result, there should be no magnetic flux in core 1102 and, therefore, no output signal on winding 1104. However, if there is a load-side ground fault 1112 coupled to load hot terminal 1108, a true ground fault current flows through hot line 13 that does not flow through neutral line 11. A difference current between the two primary windings is generated. The difference current generates a magnetic flux in toroidal core 1102 and a sensor output signal is provided to GFI detector 16 by way of resistor 1114 which is coupled to winding 1104. Resistor 1114 is typically referred to as the "burden resistance" on winding 1104. The relationship between the burden resistance and the core permeability is discussed in the following paragraph.

Those of ordinary skill in the art recognize that it is desirable to operate transformer 2 in a current transformer mode. Current transformer mode operation is advantageous because the output signal from winding 1104 is substantially independent of the permeability of core 1102. This is important because the permeability value of the core is difficult to accurately manufacture. The inductance of winding 1104 is typically 10 Henries. The corresponding inductive reactance is about 3,600 Ohms if the frequency of the AC power, i.e., the frequency of the fault current, is 60 Hz. The burden resistance is typically chosen to be about a tenth of the inductive reactance of winding 1104 at the frequency of the AC power, if transformer 2 is to operate in a current transformer mode. Therefore, there are constraints of the value of secondary winding inductance and burdening resistance (or impedance) for the proper operation of the GFI. As alluded to above, the self-test flux residue causes self test signal extension into a positive half cycle. The secondary winding inductance (L) and the burden resistance (R) establish a rate of decay of the extended test signal.

Accordingly, there is an optimal L/R time constant for the given AC power frequency, wherein L is the secondary winding inductance and R is the burden resistance on the winding. The flux that is induced by the negative half cycle self-test signal decays at a rate established by the L/R time constant. If the AC power frequency is 60 Hz, for example, the L/R time constant is typically chosen to be 15 to 30 milliseconds, as compared to the 16.6 mS period (60 Hz) of the power frequency. Although the values are described for a 60 Hz power distribution system, similar considerations apply to other frequencies that are in use, such as 50 Hz and 400 Hz. Thus, the flux residue from the negative half cycle self test interferes with the flux induced by a true ground fault for multiple AC power periods (16.6 mS per period), adversely affecting true fault current detection.

Another cause for an extended test signal is the delay time associated with filter circuit 21. Filter circuit 21 is typically a low pass filter configured to reject high frequency noise.

Figure 11:
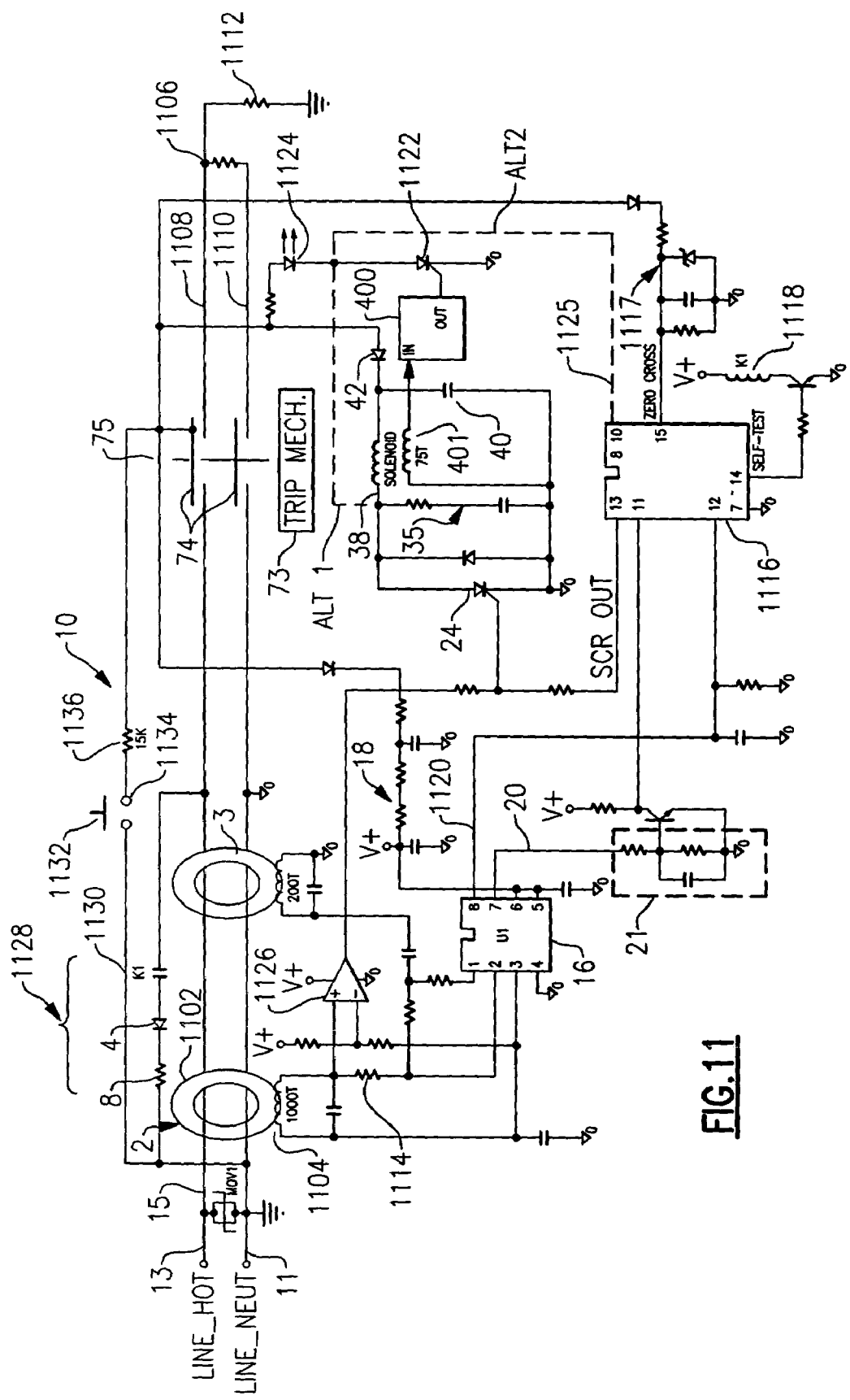
FIG. 11 is a schematic of a circuit protection device in accordance with a second embodiment of the present invention.

As embodied herein and depicted in FIG. 11, a schematic of a circuit protection device 10 in accordance with a second embodiment of the present invention is disclosed. This embodiment differs from the embodiments depicted in FIGS. 1–10 by the addition of control gate 1116, by-pass circuit 1126, and several alternative routes for the ring detector 400 output.

Control gate 1116 is coupled to detector 16 and configured to receive either detector output signal 1120 or filtered detector output signal 20. Control gate 1116 gates these signals and provides a gated and delayed detection signal to SCR 24 (SCR out). Control gate 1116 is configured to recycle between a test state and a non-test state. The durations of each of the two states are established by a timing circuit. Those of ordinary skill in the art will recognize that the timing circuit may be of any suitable type. For example, the timing circuit may be an external clocking arrangement driven by a local oscillator (not shown), a timer disposed in controller 1116, or by a zero cross circuit 1117 coupled to the AC power. As will be described in greater detail below, when control gate 1116 is in the test state, it is configured to actuate self-test relay 1118 during a negative half-cycle.

Upon actuation, self-test relay 1118 is configured to actuate the self-test circuit to initiate the self-test procedure. As described below, control gate 1116 may also receive an input 1125 from ring detector 400 via SCR 1122.

Automated self-test circuit 1128 is coupled between line hot 13 and line neutral 11. Circuit 1128 includes contacts 1130 which are disposed in series with diode 4 and resistor 8. One approach is shown in FIG. 11. Self-test signal is generated by ground fault simulation circuit 1128 when relay 1118 turns on to close contacts 1130. Those of ordinary skill in the art will recognize that test circuit 1128 may be implemented using various alternate fault simulation circuits. If contacts 1130 are configured to close during the negative half cycle, diode 4 may be omitted. Alternatively, if contacts 130 are configured to close for a full line cycle, diode 4 should be included to limit the simulated ground fault current to the negative half cycle. The current flowing through resistor 8 produces a difference current between the hot and neutral conductors, conductors 13 and 11, which is sensed by transformer 2, as has been previously described.

The various embodiments of the device may be equipped with a manually accessible test button 1132 for closing switch contacts 1134 for initiating a simulated grounded hot fault signal, as current through resistor 1136, or alternatively, a simulated grounded neutral fault signal (not shown.) If GFI 10 is operational, closure of switch contacts 1134 initiates a tripping action. The purpose of the test button feature may be to allow the user to control GFCI 10 as a switch for applying or removing power from load 1106, in which case test button 1132 and reset button 75 have been labeled "off" and "on" respectively. Usage of test button 1132 does not affect the performance of checking circuit 100, or vice-versa.

By-pass circuit 1126 is coupled to sensor 2. By-pass circuit 1126 is activated when the differential current exceeds a predetermined amount. The output of by-pass 1126 is directly connected to SCR 24. Thus, when the differential current exceeds the predetermined current, control gate 1116 is by-passed and SCR 24 is actuated and device 10 is tripped. The rationale for by-pass circuit 1126 is discussed below in greater detail.

Referring to ring detector 400, the ring detector output signal may be used in two ways. In the first alternative, line ALT 1 is directly coupled between detector output SCR 1122 and solenoid 38. In the same manner as described above, if the timer in detector 400 times out, detector 400 transmits a signal by way of ALT 1 to trip device 10. LED 1124 can be illuminated at the same time to indicate that an end-of-life condition exists. In the second alternative, ALT 1 is replaced by line ALT 2. When detector 400 indicates that an end-of-life condition exists, the signal is transmitted via line ALT 2 to input 1125 and LED 1124 is illuminated. In response to the signal from detector 400, control gate 1116 activates SCR 24 after a predetermined period of time has elapsed. In this alternative embodiment, a user is given the predetermined period of time to replace the device before power is interrupted.

It will be apparent to those of ordinary skill in the pertinent art that modifications and variations can be made to control gate 1116 of the present invention depending on device selection and design issues. For example, control gate 1116 may be implemented using a microprocessor, an application specific integrated circuit (ASIC), or a combination of other electronic devices familiar to those skilled in the art. In the example shown in FIG. 11, control gate 1116 is implemented as a discrete microprocessor component. In another embodiment, control gate 1116 is combined in an ASIC with other device components and sub-systems. For example, an ASIC may include detector 16, self-test circuit 400, and other such components.

As those of ordinary skill in the pertinent art will recognize, self-test relay 1118 may be of any suitable type depending on electrical device characteristics. For example, relay 1118 may be implemented using an electro-mechanical relay. Relay 1118 may also be implemented using a solid state switches such as a thyristor, SCR, triac, transistor, MOSFET, or other semiconductor devices.

Turning now to the operation of control gate 1116, during recurring non-test state intervals, the detector output signal 20, or 1120, is directed to control gate 1116, as previously described. When control gate 1116 is in the non-test state, control gate 1116 de-activates the negative half cycle self-test signal by turning off self-test relay 1118, permitting detection of the true fault signal while avoiding the self-test signal interference. In this state, GFI 10 may detect a true fault signal in either half cycle, but is responsive to the fault only in the positive half cycles. The duration of the non-test state intervals may be selected within a time range between one (1) second and one (1) month. One month is typically considered as being the maximum safe interval between tests. In one embodiment, the duration of the non-test state interval is about one minute. The test/non-test cycle is recurring; each non-test cycle is followed by a test state cycle, and each test cycle is followed by a non-test state cycle.

Accordingly, GFI 10 is in a self-test mode during the test state interval. In one embodiment, a self-test signal is transmitted during the first negative half cycle in the test state interval. In another embodiment, the simulated test is effected is effected in selected negative half-cycles, or in each negative half-cycle in the test interval. In the circuit example depicted in FIG. 11, control gate 1116 activates simulated fault signal during a negative half cycle by turning on self-test relay 1118. The simulated test signal causes detector 16 to produce a signal at output 20 or at an alternate output 1120 during each negative half-cycle. Output 1120 provides the same information as output 20, but is configured to generate digital logic levels. Control gate 1116 gates the detector 16 output signal received during the negative half cycle to SCR 24. The gate functions to block any extended signal for a predetermined amount of time after the negative half cycle. The predetermined time interval is chosen such that any remaining extended signal is substantially less than the expected true fault signal. The predetermined interval is typically set at 30 to 50 milliseconds. As a result, any self-test signal that extends beyond the negative half cycle does not cause false activation of SCR 24. However, the portion of the self-test signal propagating during the negative half cycles will cause the timer in ring detector 400 to reset. With regard to the predetermined time interval, by-pass circuit 1126 is provided to allow device 10 to respond in accordance with UL trip time requirements if a true fault condition occurs during the 30 to 50 millisecond dead period described above.

By-pass circuit 1126 circumvents control gate 1116 under certain circumstances. In the event of a ground fault, the operation of control gate 1116 may be delayed by capacitive charging time constants in power supply 18 and by delays in control gate 1116, including software-related delays. These delays might prevent trip mechanism 73 from interrupting high amplitude ground fault currents greater than about 100 mA within known safe maximum time limits. The trip time requirement is provided in UL 943. UL 943 includes an inverse time-current curve: $t=(20/I)^{1.43}$ where "I" is the fault current in milliamps (mA) and "t" is the trip time in seconds. Typical values for the fault current range between 6 mA and 264 mA. The 6 mA current is the "let-go threshold." In other words, UL does not consider currents less than 6 mA to be a hazard. The 264 mA limit corresponds to 132 VAC (the maximum source voltage) divided by 500 Ohms (the least body resistance for a human being). Applying the trip time curve, a 6 mA fault current is allowed a maximum trip time of 5 seconds. A 264 mA fault current is allowed a maximum trip time of 0.025 seconds. By-pass circuit 1126 is configured to actuate SCR 24 when the fault current exceeds 100 mA. According to the trip time curve, if the fault current equals 100 mA, the calculated trip time is 0.1 seconds (100 milliseconds.) Thus, the 30 to 50 millisecond dead period does not violate the UL trip time curve for true ground faults below 100 mA. For true fault currents above 100 mA, bypass circuit 1126 overrides the dead period lock-out. Accordingly, the present invention is in accordance with UL trip time requirements. Those of ordinary skill in the art will recognize that bypass circuit 1126 and detector 16 may be combined in a single monolithic integrated circuit.

Referring back to the checking circuit in FIG. 11, if GFI 10 has reached end of life, the timer internal to ring detector 400 will not be reset because of the absence of the ring pulse. At this point the timer transmits a time-out signal which results in SCR 1122 being activated and a response is initiated. As noted above, the response may include an end-of-life indication by indicator 1124. Those of ordinary skill in the art will recognize that the end-of-life indication may be a visual indication (as shown), an audible indication, or both. Alternatively, if line ALT 1 is implemented, the response can include activation of solenoid 38 to operate mouse trap device 73, or the response can include both the visual/audible indication and solenoid actuation.

If line ALT 2 is implemented in place of line ALT 1, SCR 1122 is coupled to gate controller 1116 to provide delayed circuit interruption. As in the first alternative design, the second alternative design may include both the end-of-life indication via indicator 1124 and delayed circuit interruption. Delayed circuit interruption is accomplished by activation of SCR 1122. SCR 1122 transmits a signal to control gate input 1125. In response, control gate 1116 initiates a timer and actuates SCR 24 after a pre-determined time delay. One benefit from this response method is that the user is alerted by an indication that the device has reached end-of-life. The user is then afforded a reasonable amount of time to replace the device before power to the load terminals becomes denied by the circuit interrupter. In one embodiment, the pre-determined time delay is twenty-four (24) hours. Any suitable time interval may be chosen. For example, the delay may be set at forty-eight (48) hours.

Another feature of the present invention relates to noise immunity. The sources of transient noise include switching noise from the AC power source, electrical noise associated with loads having commutating motors with brushes, or the noise associated with various kinds of lamps or appliances. Noise immunity is a consideration because transient noise may interfere with the self-test signal. Under certain circumstances, noise may interfere with, or cancel, the self-test signal. Accordingly, the timer in ring detector 400 may not be reset despite the fact that there is no internal fault condition in GFCI 10. In one embodiment, the timer in ring detector 400, or timer 52 in FIG. 1, is programmed to measure a time interval that spans four simulated test cycles, or a predetermined amount of time, such as four minutes, for example. Thus, ring detector 400 need only detect one in four ringing pulses during the time interval for timer reset. It is unlikely that a transient noise event would disturb either four consecutive negative half cycles or last for a period of 4 minutes. As such, programming the timer in this manner desensitizes GFCI 10 to the effects of transient electrical noise.

Figure 12:
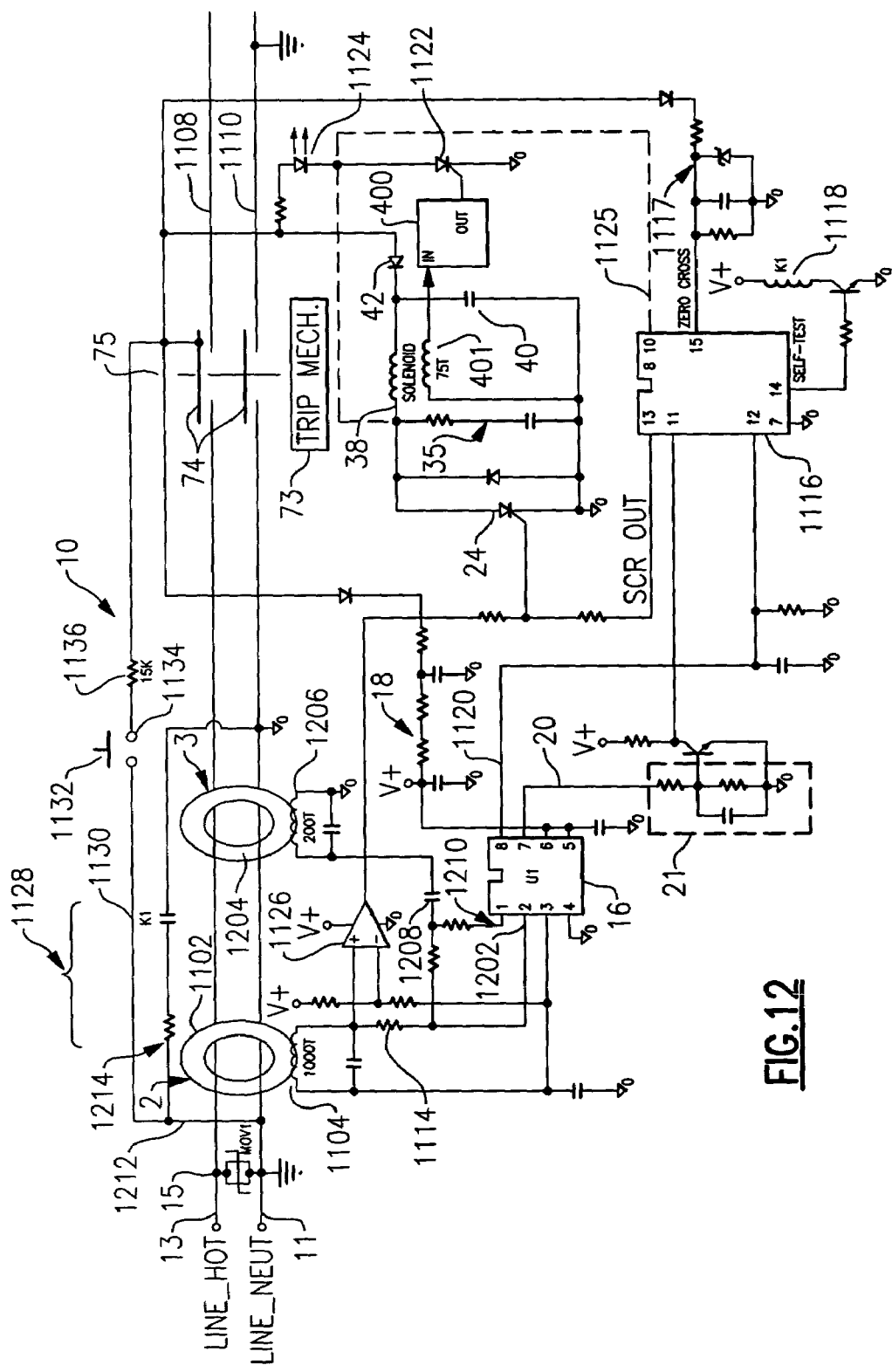
FIG. 12 is a schematic of a circuit protection device in accordance with a third embodiment of the present invention.

As embodied herein and depicted in FIG. 12, a schematic of a circuit protection device in accordance with a third embodiment of the present invention is disclosed. FIG. 12 is a schematic diagram of an alternate embodiment in which the fault simulation circuit generates a simulated negative half cycle grounded neutral signal. Reference is made to U.S. patent application Ser. No. 10/768,530, which is incorporated herein by reference as though fully set forth in its entirety, for a more detailed explanation of the fault simulation signal. Note that test circuit 1128 does not include diode 4.

The GFI circuit 102 in FIG. 12 includes a transformer 2 that is configured to sense a load-side ground fault when there is a difference in current between the hot and neutral conductors. Transformer 2 sends sensed signal to detector circuit 16. GFI circuit 102 also includes a grounded neutral transmitter 3 that is configured to detect grounded neutral conditions. Those skilled in the art understand that the conductor connected to neutral line terminal 11 is deliberately grounded in the electrical circuit. On the other hand, a grounded neutral condition occurs when a conductor connected to load neutral terminal 1110 is accidentally grounded.

The grounded neutral condition creates a parallel conductive path with the return path disposed between load terminal 1110 and line terminal 11. When a grounded neutral condition is not present, grounded neutral transmitter 3 is configured to couple equal signals into the hot and neutral conductors. As noted above, transformer 2 senses a current differential. Thus, when no fault condition exists, the current flowing in the hot conductor cancels the current flowing in the neutral conductor. However, when a grounded neutral condition is present, the signal coupled onto the neutral conductor circulates as a current around the parallel conductive path and the return path, forming a conductive loop 1212. Since the circulating current conducts through the neutral conductor but not the hot conductor, a differential current is generated. Transformer 2 detects the differential current between the hot and neutral conductors. As such, detector 16 produces a signal on output 20 in response to the grounded neutral condition.

In one embodiment, ground fault detector 16 is implemented using an RV 4141 integrated circuit manufactured by Fairchild Semiconductor which receives signal from transformer 2. Those of ordinary skill in the art will understand that any suitable device may be employed herein. As in previous embodiments, transformer 2 includes a toroidally shaped magnetic core 1102 about which a winding 1104 is wound. Winding 1104 is coupled to an input terminal 1202 of ground fault detector 16. Winding 1104 typically has 1,000 turns. Grounded neutral transmitter 3 comprises a second toroidally shaped magnetic core 1204 about which a winding 1206 is wound. Winding 1206 is coupled in series with a capacitor 1208 to the gain output terminal 1210 of ground fault detector 16. Winding 1206 typically has 200 turns. Hot and neutral conductors 13 and 11 pass through the apertures of cores 1102 and 1204. During a grounded neutral condition, low level electrical noise indigenous to the electrical circuit or to ground fault detector 16 creates a magnetic flux in either core 1102 or 1204, or both. The flux in core 1204 is induced by winding 1206. Core 1204 induces a circulating current in electrical loop 1212, which induces a flux in core 1102. The resulting signal from winding 1104 is amplified by the gain of ground fault detector 16 to produce an even greater flux in core 1204 via winding 1206. Because of this regenerative feedback action, ground fault detector 16 breaks into oscillation. The frequency typically is in a range between 5 kHz and 10 kHz. This oscillation produces a signal on output 20. Control gate 1116 ultimately signals SCR 24 to trip the device 10.

Electrical loop 1212 is part of the fault simulation circuit 1128. Loop 1212 has a resistance associated with it. The resistance is shown in FIG. 12 as lumped resistance 1214. Resistance 1214 is typically less than 2 Ohms. Electrical loop 1212 couples the grounded neutral transmitter 3 and ground fault detector 2 when contacts 1130 are closed during the first negative half cycle of each test state interval. Accordingly, a simulated grounded neutral condition is generated only during the negative half cycle. The simulated grounded neutral condition causes detector 16 to generate a fault detect output signal on line 20 to retrigger the timer in ring detector 400 during test state intervals. Absence of the timer reset signal indicates that the device has reached its end of life. As previously discussed, the end of life condition causes activation of an end of life indicator, tripping of interrupting contacts, or both.

Again, the various embodiments of the device may be equipped with a manually accessible test button 1132 configured to close switch contacts 1134. Upon closure of contacts 1134, current flows through resistor 1136 and a simulated grounded hot fault signal is initiated. In another embodiment, a simulated grounded neutral fault signal (not shown) is initiated by actuating test button 1132. If GFI 10 is operational, closure of switch contacts 1134 initiates a tripping action. The purpose of the test button feature may be to allow the user to control GFCI 10 as a switch for applying or removing power from load 1106. As such, test button 1132 and reset button 75 may be labeled "off" and "on," respectively. Usage of test button 1132 does not affect the performance of checking circuit 100, or vice-versa.

Figure 13:
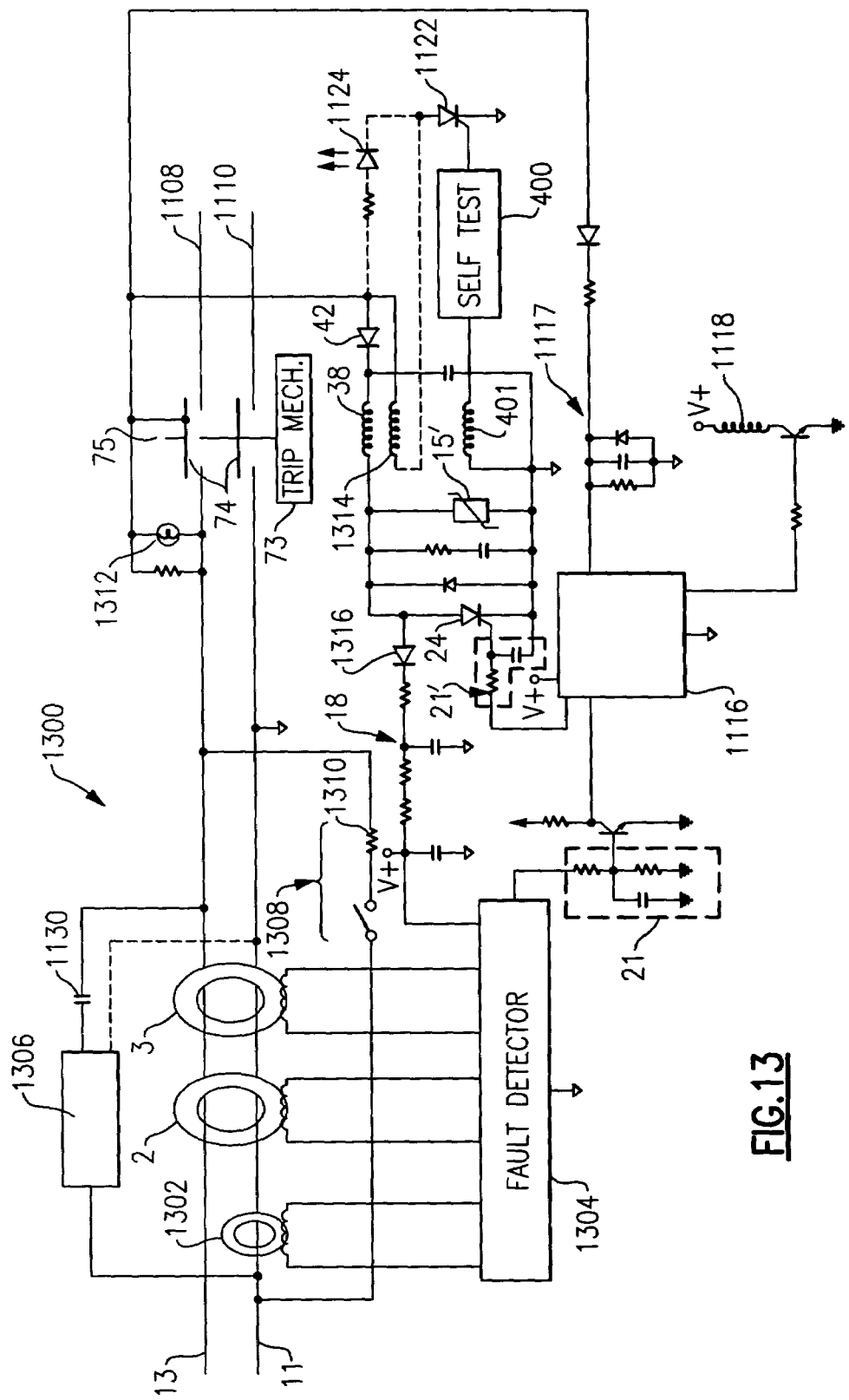
FIG. 13 is a schematic of a circuit protection device in accordance with a fourth embodiment of the present invention.

As embodied herein and depicted in FIG. 13, a schematic of a circuit protection device in accordance with yet another embodiment of the present invention is disclosed. FIG. 13 is a schematic diagram that illustrates how the present invention may be applied to a general protective device 1300. If sensor 1302 is included, the protective device is an AFCI. If transformers 2 and 3 are included, the protective device is a GFCI. If sensor 1302, and transformers 2 and 3 are included, the protective device is a combination AFCI-GFCI. Stated generally, the protective device may include one or more, or a combination of sensors configured to sense one or more type of hazardous conditions in the load, or in the AC electrical circuit supplying power to the load. Sensor 1302 senses an arc fault signature in load current. Detector 1304 is similar to ground fault detector 16, but is configured to detect signals from any of the variety of sensors employed in the design. Detector may also provide a signal to a transmitter, such as transformer 3.

Fault simulation circuit 1306 is similar to fault simulation circuit 1128 but configured to produce one or more simulation signal to confirm that the protective device is operational. Contacts 1130 are closed by operation of relay 1118 during a test state interval. A fault simulation signal is thereby generated during the negative half cycle of the AC power line. The embodiment of FIG. 13 is similar to the previous embodiments discussed herein, in that extended test fault signal from fault detector 1304 to SCR 24 is blocked by control gate 1116. In this manner, simulation signal that extends into positive half cycles of the AC power line do not result SCR 24 being turned on, which would otherwise cause false actuation of the circuit interrupter.

Other features and benefits can be added to the various embodiments of the invention. GFCI 10 may be equipped with a miswiring detection feature such as miswire network 1308. Reference is made to U.S. Pat. No. 6,522,510, which is incorporated herein by reference as though fully set forth in its entirety, for a more detailed explanation of miswire network 1308. Briefly stated, miswire network 1308 is configured to produce a simulated ground fault condition. During the installation of protective device 1300 if the power source voltage is coupled to the line terminals 11 and 13 as intended, the current through network 1308 causes the protective device to trip. However, the current through network 1308 continues to flow until a fusible component in network 1308 open circuits due to $1^2R$ heating. The fusible component may be implemented by resistor 1310, which is configured to fuse in typically 1 to 10 seconds. The protective device 1300 may be reset after the fusible component opens. Subsequently, the protective device 1300 and checking circuit 100 operate in the previously described manner. However, when the device is miswired by connecting the power source to the load terminals 1108 and 1110 during installation, GFI 102 trips the interrupting contacts 74 before the fusible component opens. The current flow through network 1308 is terminated in less than 0.1 seconds. This time period is too brief an interval to cause the fusible component to fail. Thus, when protective device 1300 is miswired, the fusible element in network 1308 remains intact. Accordingly, reset button 75 cannot effect a resetting action. Protective device 1300 cannot be reset regardless of signals to or from checking circuit 100.

As discussed above and shown in FIG. 1, an across-the-line metal oxide varistor (MOV), also commonly referred to as a movistor, may be included in the protective device to prevent damage of the protective device from high voltage surges from the AC power source. The movistor is typically 12 mm in size. Alternatively, a much smaller MOV may be employed in the circuit when it is coupled with an inductance. In this embodiment, MOV 15' is coupled with solenoid 38. The value of the inductive reactance of solenoid 38 is typically greater than 50 Ohms at the frequency of the surge voltage. The inductive reactance serves to reduce the surge current absorbed by the movistor, permitting MOV 15' to have a lower energy rating. Accordingly, the size of the movistor may be reduced to a 5 mm diameter device. Further, the MOV may be replaced altogether by a surge-absorbing capacitor, air gap, or any of other surge protection methods familiar to those who are skilled in the art.

Protective device 1300 may also include a trip indicator 1312. Indicator 1312 is configured to illuminate a trip indication, or audibly annunciate a trip indication, when protective device 1300 is tripped. Trip indicator 1312 also functions to direct the user to the location of the tripped device.

Another feature of the embodiment shown in FIG. 13 relates to the dual solenoid design. Upon reaching end-of-life, solenoid 38 typically fails by developing an open circuit condition. Solenoid 1314 may be added to checking circuit 100 to provide redundancy. If solenoid 38 open circuits, secondary 401 does not receive self-test signal. However, checking circuit 100 is able to trip out the protective device by actuating solenoid 1314. Solenoid 1314 may be magnetically coupled to solenoid 38. Other redundancies may be included in device 1300. Redundant components permit the protective device and/or permit checking circuit 100 to function. For example, diode 1316 included in power supply 18 can comprise two diodes in parallel, such that if one diode open circuits, that second diode continues to maintain supply voltage.

Figure 14:
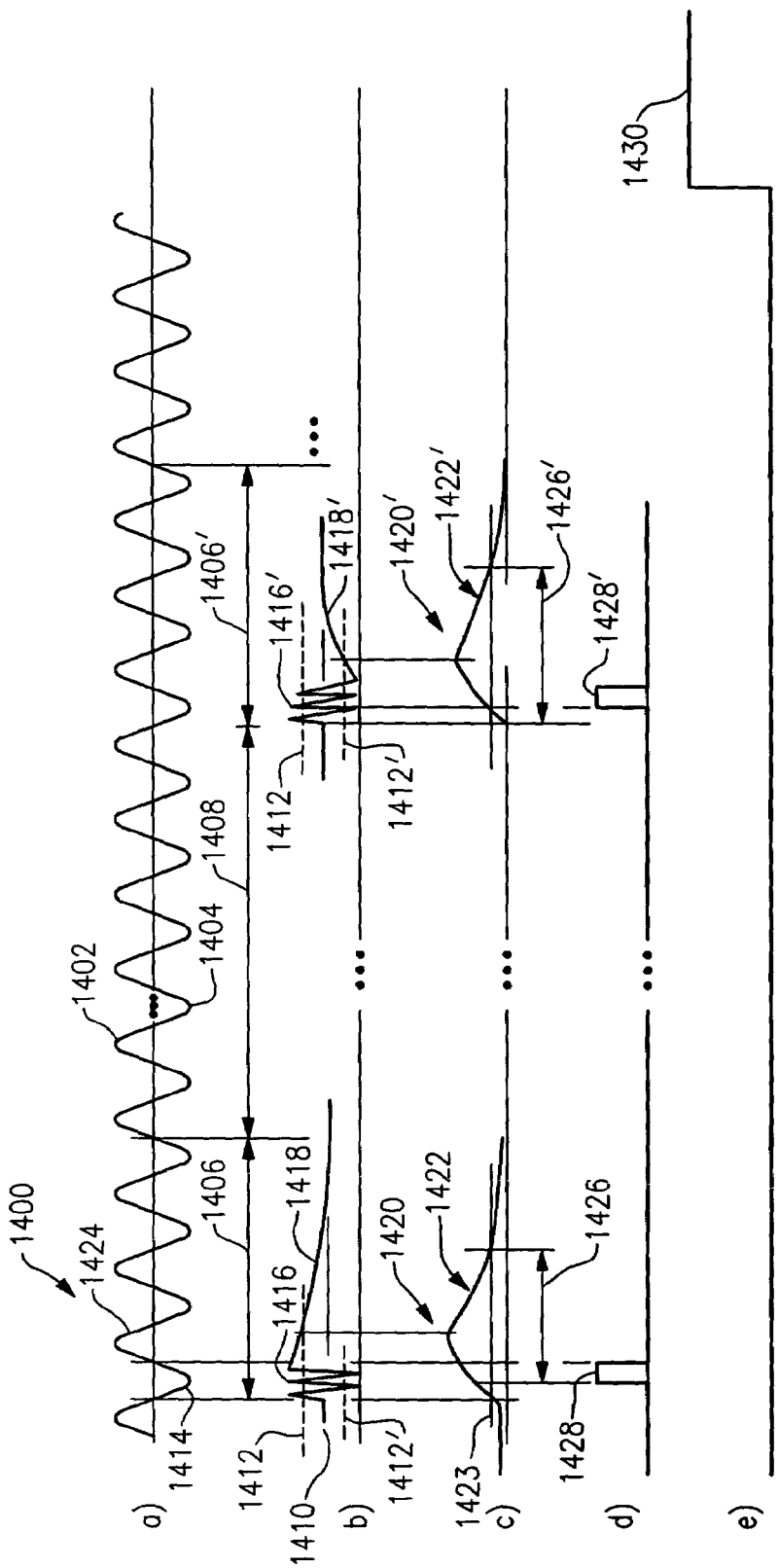
FIG. 14 is an example of a timing diagram illustrating the operation of the circuit depicted in FIG. 12.

Referring to FIG. 14, a timing diagram illustrating the operation of the circuit depicted in FIG. 12 is shown. FIG. 14a shows the AC power source signal 1400. AC signal 1400 includes positive half cycles 1402 and negative half cycles 1404. Control gate 1116 subdivides time into alternating test state interval 1406 and non-test state interval 1408. FIG. 14b represents the gain output waveform at detector input terminal 1210. Voltage signal 1410 is the quiescent level when there is no fault condition, whether a simulated fault condition or true fault condition. The quiescent voltage level 1410 is centered between pre-established voltage thresholds 1412 and 1412'. The threshold levels are established by ground fault detector 16. During the first negative half cycle 1414 within second state interval 1406, contacts 1130 close, initiating a simulated grounded neutral fault. The simulated grounded neutral fault results in signal 1416. The positive amplitude and the negative amplitude of signal 1416 is greater than voltage threshold 1412 or less than voltage threshold 1412', respectively. Both the positive amplitude peak and the negative amplitude nadir cause detector 16 to generate a detection signal at output 20. FIG. 14c represents the resultant signal from filter circuit 21. Control gate 1116 couples signals 1416 to timer 52 (embodiment of FIG. 1), or the timer internal to detector 400, causing the timer to reset. Although the simulated grounded neutral fault terminates abruptly at the conclusion of negative half cycle 1414, there is residual flux in core 1102, shown electrically as transient 1418. The transient signal is delayed by filter circuit 21. The delayed transient is shown in FIG. 14c as delayed transient signal 1422.

Referring to FIGS. 14c–14d, the residual flux and other similar effects cause the self-test signal 1420 to extend into positive half cycles 1424. Note that a portion 1426 of delayed transient signal 1422 extends into the next positive half cycle and exceeds the predetermined threshold 1423. Referring to FIG. 14d, control gate 1116 transmits pulse 1428 to SCR 24. Pulse 1428 corresponds to that portion of signal 1420 propagating during the negative half cycle 1414. Thus, control gate 1116 prevents nuisance tripping.

Referring back to FIG. 14a, test state intervals 1406 are typically chosen to be 50 milliseconds, a time interval that is greater than the expected intervals of transients 1418 and 1422. As such, non-test state intervals 1408 are devoid of test signal transients (extended signal.) However, if a true fault current is present during either interval, the fault is detected by detector 16, filtered by circuit 21, and coupled to SCR 24 by control gate 1116 in the manner previously described herein.

Referring back to the issue of transient electrical noise, the elapsed time measured by timer 52 can be increased to include one or more test state intervals. If the transient electrical noise interferes with the generation of pulse 1428, the fault detection circuitry may generate pulse 1428' during a subsequent test state interval. Because the timer is configured to measure more than one set of test and non-test state intervals, the timer may be reset before a false end-of-life tripping occurs. In this manner, false end-of-life indication can be avoided by selecting an established time that is greater than the duration of at least two first state intervals.

FIG. 14e shows the output of timer 52. If a retrigger signal is not received by timer 52 within the established time set by timer 52, timer 52 generates signal 1430 which actuates the end-of-life response mechanism.

Although the timing diagrams in FIG. 14 have been described in association with the embodiment shown in FIG. 12, the principles of operation similarly apply to the other embodiments of the invention.

Figure 15:
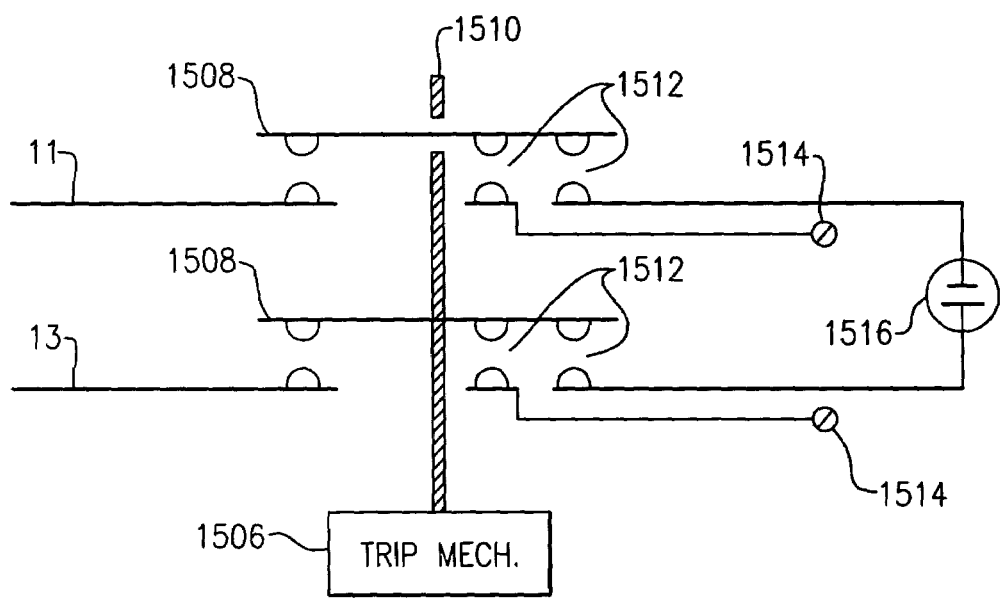
FIG. 15 is an alternate circuit interrupter in accordance with the present invention.

Referring to FIG. 15, an alternate circuit interrupter is described. The circuit interrupter includes trip mechanism 1506, interrupting contacts 1508 and reset button 1510 that are similar to previously described element designated as reference elements 73, 74 and 75. The circuit interrupter is coupled to line conductors 11 and 13 and is configured to decouple one or more loads from the utility source when a true fault condition or a simulated fault condition has been detected, or when an automated self-test signal has failed. In particular, when decoupling occurs there is a plurality of air gaps 1512 that serve to electrically isolate a plurality of load structures from one another. The load may include, for example, feed-through terminals 1514 that are disposed in the protective device. The feed through terminals are configured to connect wires to a subsequent portion of the branch electrical circuit. The portion of the branch circuit, in turn, is protected by the protective device. The load structures can also include at least one user accessible plug receptacle 1516 disposed in the protective device. The plug receptacle is configured to mate with an attachment plug of a user attachable load. Accordingly, the user load is likewise protected by the protective device.

As has been previously described, if the device 10 (1300) is inadvertently miswired during installation into the branch electrical circuit, i.e., source voltage is connected to the feed-through terminals 1514, the protective device can be configured so as to only momentarily reset each time resetting is attempted, e.g. each time the reset button 1510 is depressed. Alternatively, the protective device can be configured so that during a miswired condition, the ability to reset the device 10 (1300) is blocked. In either case, air gap(s) 1512 prevent power from the utility source at feed-through terminals 1514 from powering plug receptacle(s) 1516. At least one air gap 1512 can be provided for each utility source hot conductor. The user is protected from a fault condition in the user attachable load. Alternatively, at least one air gap 1512 can be provided but in a single utility source conductor. Power to receptacle 1516 would be denied. Therefore the user would be motivated to remedy the miswired condition before a fault condition is likely to arise. In yet another alternative, utility source conductors may selectively include air gaps 1512 for electrically decoupling the load structures.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. An electrical wiring protection device for use in coupling AC power through an AC power distribution system to at least one electrical load, the device comprising:

an automated self-test circuit coupled to the AC power distribution system and configured to generate at least one simulated fault signal during a first predetermined half-cycle polarity of AC power;

a detector circuit coupled to the automated self-test circuit, the detector circuit generating a detection signal in response to the at least one simulated fault signal; and an interval timing circuit coupled to the automated self-test circuit, the interval timing circuit being configured to enable the automated self-test circuit to generate the at least one simulated fault signal during a first predetermined interval and not enable the automated self-test circuit during a subsequent second predetermined interval, the first predetermined interval and the second predetermined interval being recurring time intervals.

2. The device of claim 1, further comprising:
a gate circuit coupled to the detector circuit, the gate circuit generating a gated test detection pulse in response to receiving the detection signal, the gated test detection pulse corresponding to the at least one simulated fault signal and having a duration not extending into a second predetermined half-cycle polarity of AC power; and
a checking circuit coupled to the gate circuit, the checking circuit including a timer configured to initiate an end-of-life fault signal if the gated test detection pulse is not received within a predetermined period of time.

3. The device of claim 2, further comprising a response mechanism coupled to the checking circuit, the response mechanism being actuated in response to the end-of-life fault signal.

4. The device of claim 3, wherein the response mechanism does not respond to the gated test detection pulse.

5. The device of claim 3, wherein the response mechanism includes a circuit interrupter configured to decouple the AC power from the at least one electrical load.

6. The device of claim 5, wherein the circuit interrupter includes a first and second solenoid, the first solenoid being activated by the end-of-life fault signal, the second solenoid being activated by a gated fault detection pulse, the gated fault detection pulse being generated in response to a fault in the AC power distribution system.

7. The device of claim 5, further comprising a reset mechanism configured to reset the circuit interrupter after the AC power distribution system is decoupled from the at least one load.

8. The device of claim 5, further comprising a trip light indicator configured to emit light when the circuit interrupter is in a tripped state.

9. The device of claim 2, wherein the checking circuit transmits the end-of-life fault signal to the gate circuit, the gate circuit providing the response mechanism with a gated end-of-life detection pulse, the response mechanism being actuated in response to the gated end-of-life detection pulse.

10. The device of claim 3, wherein the response mechanism includes an indicator device configured to alert a user to the presence of the end-of-life condition.

11. The device of claim 10, wherein the indicator device includes at least one light emitting element and/or an audible annunciator.

12. The device of claim 3, wherein the detection circuit is configured to generate a fault detection signal in response to a true fault signal, the gate circuit being configured to generate a gated fault detection pulse in response to receiving the fault detection signal, the gated fault detection pulse being transmitted in the second predetermined half-cycle polarity of AC power.

13. The device of claim 12, wherein the response mechanism is responsive to the gated fault detection pulse.

14. The device of claim 12, further comprising a circuit interrupter configured to decouple the AC power distribution system from the at least one electrical load in response to the gated fault detection pulse.

15. The device of claim 2, wherein the checking circuit further comprises a ring circuit coupled to the gate circuit, the ring circuit generating a ringing signal in response to the gated test detection pulse if each of a plurality of device components are operational.

16. The device of claim 15, wherein the plurality of device components are selected from a group including the automated self-test circuit, the detector circuit, the interval timer, the gate circuit, a trip solenoid, a diode, a resistor, a capacitor, a snubber circuit, a silicon controlled rectifier (SCR), and/or a self test relay circuit.

17. The device of claim 1, further comprising:
a bypass circuit coupled to the detector circuit, the bypass circuit generating a bypass detection signal in response to sensing a fault current in the AC power distribution system exceeding a predetermined threshold; and
a response mechanism coupled to the bypass circuit, the response mechanism being configured to decouple the AC power distribution system from the at least one load in response to receiving the bypass detection signal.

18. The device of claim 17, wherein the bypass detection signal is generated in either the first predetermined half cycle of AC power or the second predetermined half-cycle of AC power and/or the first predetermined interval or second predetermined interval.

19. The device of claim 1, wherein the detector circuit includes a ground fault sensor.

20. The device of claim 1, wherein the detector circuit includes a grounded neutral sensor.

21. The device of claim 1, wherein the detector circuit includes an arc fault sensor.

22. The device of claim 1, further comprising a self-test relay circuit coupled between the interval timer and the automated self-test circuit, the self-test relay circuit being configured to actuate the automated self-test circuit in response to a signal from the interval timer.

23. The device of claim 1, further comprising load terminals configured to couple AC power to the at least one electrical load and a miswire prevention circuit that detects if AC power has been miswired to the load terminals.

24. The device of claim 23, further comprising a circuit interrupter configured to decouple the AC power distribution system from the at least one electrical load when the miswire prevention circuit produces an output signal.

25. An electrical wiring protection device for use in coupling an AC power through an AC power distribution system to at least one electrical load, the device comprising:
a test circuit coupled between a hot conductor and a neutral conductor of the AC power distribution system, the test circuit being configured to generate at least one simulated fault signal during a first predetermined half-cycle polarity of AC power;
a detector circuit coupled to the test circuit, the detector circuit generating a detection signal in response to the at least one simulated fault signal;
an interval timing circuit coupled to the test circuit, the interval timing circuit being configured to enable the test circuit to generate the at least one simulated fault signal during a first predetermined interval and not enable the test circuit during a subsequent second predetermined interval, the first predetermined interval and the second predetermined interval being recurring time intervals;
a gate circuit coupled to the detector circuit, the gate circuit generating a gated test detection pulse in response to receiving the detection signal, the gated test detection pulse corresponding to the at least one simulated fault signal and having a duration not extending into a second predetermined half-cycle polarity of AC power subsequent to the first predetermined half-cycle of AC power;

a checking circuit coupled to the gate circuit, the checking circuit including a timer configured to initiate an end-of-life fault signal if the gated test detection pulse is not received within a predetermined period of time; and a response mechanism coupled to the checking circuit, the response mechanism being actuated in response to the end-of-life fault signal.

26. The device of claim 25, wherein one or more of the detector circuit, interval timing circuit, gate circuit, and/or checking circuit are disposed in an integrated chip (IC).

27. The device of claim 26, wherein the IC includes a microprocessor, an application specific IC (ASIC), and/or a microprocessor and an ASIC.

28. The device of claim 25, wherein one or more of the detector circuit, interval timing circuit, gate circuit, and/or checking circuit are implemented using discrete circuit components.

29. The device of claim 25, wherein the response mechanism includes a circuit interrupter configured to decouple the AC power distribution system from the at least one electrical load and/or an indicator device configured to alert a user to the presence of the end-of-life condition.

30. The device of claim 29, wherein the circuit interrupter includes a first and second solenoid, the first solenoid being activated by the end-of-life fault signal, the second solenoid being activated by a gated fault detection signal corresponding to a fault in the AC power distribution system.

31. The device of claim 29, wherein said circuit interrupter includes a reset mechanism configured to reset the circuit interrupter after the AC power distribution system has been decoupled from the at least one load.

32. The device of claim 29, wherein the response mechanism further comprises a delay circuit, the delay circuit being configured to delay actuation of the circuit interrupter for a predetermined delay interval, whereas the indicator device being actuated immediately in response to the end-of-life fault signal.

33. The device of claim 32, wherein the predetermined delay interval is less than or equal to forty-eight (48) hours.

34. The device of claim 29, wherein the detection circuit is configured to generate a fault detection signal in response to a true fault signal, and the gate circuit is configured to generate a gated fault detection pulse in response to receiving the fault detection signal, the gated fault detection pulse being transmitted in the second predetermined half-cycle polarity of AC power, the circuit interrupter decoupling the AC power distribution system from the at least one load in response to receiving the gated fault detection pulse.

35. The device of claim 34, further comprising a bypass circuit coupled between the detector circuit and the circuit interrupter, the bypass circuit generating a bypass detection signal in response to sensing a fault current in the AC power distribution system exceeding a predetermined threshold, the circuit interrupter decoupling the AC power distribution system from the at least one load in response to receiving the bypass detection signal.

36. The device of claim 35, wherein the predetermined threshold is substantially equal to 100 mA.

37. The device of claim 34, wherein the bypass detection signal is generated in either the first or second predetermined intervals.

38. The device of claim 25, wherein the checking circuit further comprises a ring circuit coupled to the gate circuit, the ring circuit being configured to generate a ringing signal in response to the gated test detection pulse if each of a plurality of device components are operational.

39. The device of claim 38, wherein the ring circuit includes a resonating tank circuit.

40. The device of claim 25, wherein the time interval from the gated test detection pulse to a minimum detection threshold value of the detection signal is in a range between 30 to 50 milliseconds.

41. The device of claim 25, wherein the detector circuit includes a ground fault sensor.

42. The device of claim 25, wherein the detector circuit includes a grounded neutral sensor.

43. The device of claim 25, wherein the detector circuit includes an arc fault sensor.

44. The device of claim 25, further comprising a self-test relay circuit coupled between the interval timer and the automated self-test circuit, the self-test relay circuit being configured to actuate the automated self-test circuit in response to a signal from the interval timer.

45. The device of claim 25, wherein the checking circuit transmits the end-of-life fault signal to the gate circuit, the gate circuit gating the end-of-life fault signal and providing the response mechanism with a gated end-of-life detection pulse in response thereto, the response mechanism being actuated in response to the gated end-of-life detection pulse.

46. The device of claim 25, wherein the response mechanism is not responsive to the gated test detection pulse.

47. The device of claim 25, further comprising load terminals for coupling AC power to the at least one electrcial load and a miswire prevention circuit configured to detect a miswiring condition, wherein the miswiring condition includes coupling AC power to the load terminals.

48. An electrical wiring protection device for use in coupling an AC power distribution system to at least one electrical load, the device comprising:

a test circuit coupled to the AC power distribution system and configured to generate at least one simulated fault signal during a first predetermined half-cycle polarity of AC power;

a detector circuit coupled to the test circuit, the detector circuit generating a detection signal in response to the at least one simulated fault signal;

a processor coupled to the test circuit and the detector circuit, the processor being programmed to, generate a self-test enable signal during a first predetermined time interval and not during a second predetermined time interval, the self-test enable signal enabling the test circuit to generate the at least one simulated fault signal, and generate a gated test detection pulse in response to receiving the detection signal, the gated test detection pulse corresponding to the at least one simulated fault signal and having a pulse duration not extending into a second predetermined half cycle polarity of AC power subsequent to the first predetermined half-cycle polarity of AC power;

a checking circuit coupled to the processor, the checking circuit including a timer configured to initiate an end-of-life fault signal if the gated test detection pulse is not received within a predetermined period of time; and a response mechanism coupled to the checking circuit, the response mechanism being actuated in response to the end-of-life fault signal.

49. The device of claim 48, wherein the response mechanism is coupled to the checking circuit, and the gate circuit.

50. The device of claim 48, wherein the processor includes a microprocessor and/or an application specific integrated chip (ASIC).

51. The device of claim 48, wherein the response mechanism includes a circuit interrupter configured to decouple the AC power distribution system from the at least one electrical load and/or an indicator device configured to alert a user to the presence of the end-of-life-condition.

52. The device of claim 51, wherein the circuit interrupter includes a first and second solenoid, the first solenoid being activated by the end-of-life fault signal, the second solenoid being activated by a gated fault detection signal corresponding to a fault in the AC power distribution system.

53. The device of claim 51, wherein said circuit interrupter includes a reset mechanism configured to reset the circuit interrupter after the AC power distribution system has been decoupled from the at least one load.

54. The device of claim 51, wherein the indicator device includes at least one light emitting element and/or an audible annunciator.

55. The device of claim 51, further comprising a bypass circuit coupled between the detector circuit and the circuit interrupter, the bypass circuit generating a bypass detection signal in response to sensing a fault current in the AC power distribution system exceeding a predetermined threshold, the circuit interrupter being configured to decouple the AC power distribution system from the at least one load in response to receiving the bypass detection signal.

56. The device of claim 55, wherein the predetermined threshold is substantially equal to 100 mA.

57. The device of claim 55, wherein the bypass detection signal is generated in either the first predetermined half cycle of AC power or the second predetermined half-cycle of AC power, or the first predetermined time interval or the second predetermined time interval.

58. The protection device of claim 48, further comprising a trip light indicator configured to light when the circuit interrupter is tripped.

59. The device of claim 48, wherein the response mechanism further comprises a delay circuit, the delay circuit being configured to delay actuation of the circuit interrupter for a predetermined delay interval, the indicator device being actuated immediately, in response to the end-of-life fault signal.

60. The device of claim 48, wherein the checking circuit further comprises a ring circuit coupled to the gate circuit, the ring circuit being configured to generate a ringing signal in response to the gated test detection pulse if each of a plurality of device components are operational.

61. The device of claim 48, wherein the detection circuit is configured to generate a fault detection signal in response to a true fault signal, and the processor is configured to generate a gated fault detection pulse in response to receiving the fault detection signal, the gated fault detection pulse being transmitted in the second predetermined half-cycle polarity of AC power, the response mechanism being actuated in response to the gated fault detection pulse.

62. The device of claim 48, wherein the checking circuit transmits the end-of-life fault signal to the processor, and the processor providing the response mechanism with a gated end-of-life detection pulse in response thereto, the response mechanism being actuated in response to the gated end-of-life detection pulse.

63. The device of claim 48, wherein the response mechanism is not responsive to the gated test detection pulse.

64. The device of claim 48, wherein the detector circuit includes a ground fault sensor.

65. The device of claim 48, wherein the detector circuit includes a grounded neutral sensor.

66. The device of claim 48, wherein the detector circuit includes an arc fault sensor.

67. The device of claim 48, further comprising load terminals for coupling AC power to the at least one electrical load and a miswire prevention circuit that detects if AC power has been miswired to the load terminals.

68. The device of claim 67, further comprising a circuit interrupter configured to decouple the AC power distribution system from the at least one electrical load when the miswire prevention circuit produces an output signal.

69. A method for automatically self testing an electrical wiring protection device for use in coupling an AC power distribution system to at least one electrical load, the device comprising:
generating at least one simulated fault signal during a first predetermined polarity of AC power, the at least one simulated fault being generated during a test state interval and not being generated during a subsequent non-test state interval, the test state interval and the non-test state interval being recurring time intervals each of predetermined length;
transmitting a detection signal in response to detecting the at least one simulated fault signal;
generating a gated test detection pulse in response to the detection signal, the gated test detection pulse having a pulse duration not extending into a secpond predetermined polarity of AC power; and
initiating an end-of-life fault signal if the gated detection pulse is not received within a predetermined period of time.

70. The method of claim 69, further comprising the step of actuating a response mechanism in response to the end-of-life fault signal.

71. The method of claim 69, further comprising the step of gating the end-of-life fault signal, wherein the response mechanism is responsive to the gated end-of-life mechanism.

* * * * *

UNITED STATES PATENT AND TRADEMARK OFFICE
CERTIFICATE OF CORRECTION

PATENT NO.   : 6,980,005 B2
DATED        : December 27, 2005
INVENTOR(S)  : David A. Finlay, Sr. and Jeffrey C. Richards It is certified that error appears in the above-identified patent and that said Letters Patent is hereby corrected as shown below:

<u>Title page,</u>
Item [73], Assignee, should read -- Pass & Seymour, Inc., Syracuse, NY (US) --.

Signed and Sealed this

Twenty-eighth Day of February, 2006

JON W. DUDAS
*Director of the United States Patent and Trademark Office*

UNITED STATES PATENT AND TRADEMARK OFFICE
Certificate

Patent No. 6,980,005 B2　　　　　　　　　　　　　　　　　　Patented: December 27, 2005

On petition requesting issuance of a certificate for correction of inventorship pursuant to 35 U.S.C. 256, it has been found that the above identified patent, through error and without any deceptive intent, improperly sets forth the inventorship.
    Accordingly, it is hereby certified that the correct inventorship of this patent is: David A. Finlay, Sr., Marietta, NY (US); Jeffrey C. Richards, Baldwinsville, NY (US); and Bruce F. Macbeth, Syracuse, NY (US).

Signed and Sealed this Twelfth Day of January 2010.

<div style="text-align:right">

ANDREW H. HIRSHFELD
*Supervisory Patent Examiner*
Art Unit 2858

</div>